(12) United States Patent
Sabia

(10) Patent No.: US 6,669,536 B2
(45) Date of Patent: Dec. 30, 2003

(54) METHOD OF MAKING OPTICAL FLUORIDE LASER CRYSTAL COMPONENTS

(75) Inventor: Robert Sabia, Big Flats, NY (US)

(73) Assignee: Corning Incorporated, Corning, NY (US)

(*) Notice: Subject to any disclaimer, the term of this patent is extended or adjusted under 35 U.S.C. 154(b) by 52 days.

(21) Appl. No.: 09/734,531

(22) Filed: Dec. 11, 2000

(65) Prior Publication Data

US 2003/0148711 A1 Aug. 7, 2003

(51) Int. Cl.[7] .................................................. B24B 1/00
(52) U.S. Cl. ............................................ 451/41; 451/36
(58) Field of Search ............................... 451/36–37, 41, 451/42; 252/79.1–79.5; 216/88, 89; 438/690–693, 745; 106/3; 428/397, 400, 401, 402, 404, 406

(56) References Cited

U.S. PATENT DOCUMENTS 5,879,649 A 3/1999 Henderson et al.
6,159,077 A 12/2000 Sabia et al.

FOREIGN PATENT DOCUMENTS

EP 0 846 741 6/1998
EP 0 896 042 2/1999

OTHER PUBLICATIONS

Aitcin, P.C. et al., Physical and Chemical Characterization of Condensed Silica Fumes, Ceramic Bulletin, vol. 63, No. 12, 1984, pp. 1487–1491.

Primary Examiner—Robert A. Rose
(74) Attorney, Agent, or Firm—Edward F. Murphy; Walter M. Douglas

(57) ABSTRACT

The method of making optical fluoride crystal components provide optical components with beneficial final polished transmission surfaces for transmitting below 200 nm wavelengths of light, such as produced by excimer lasers and utilized in optical lithography. The invention utilizes colloidal silica soot in the polishing of optical fluoride crystal surfaces. This colloidal silica soot is a byproduct of chemical vapor deposition processing of fused silica or ultra low expansion glasses. The colloidal silica byproduct is referred to as "soot". Retaining the same physical properties as the parent glass and having a spherical morphology, the colloidal silica soot is an ideal for final polishing applications of optical fluoride crystals, and particularly for optical fluoride crystals such as calcium fluoride which have high transmission levels to below 300 nm light such as produced by excimer lasers. The soot has a large particle size and spherical shape when compared to conventional colloidal or fumed silica.

63 Claims, 22 Drawing Sheets

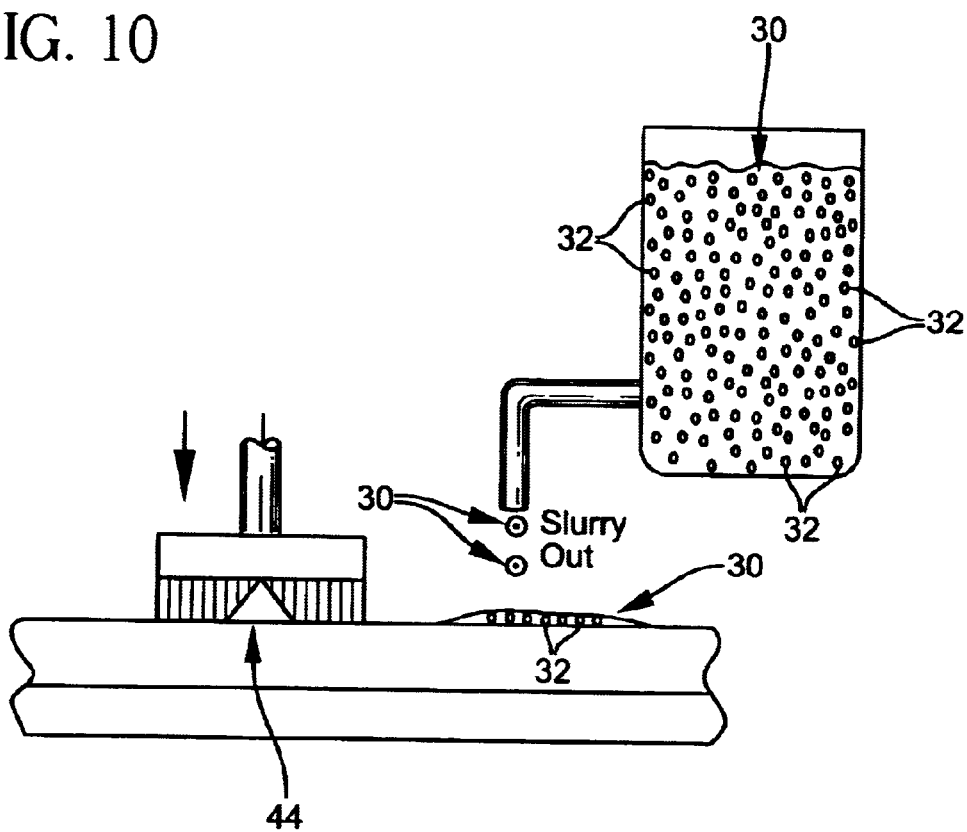

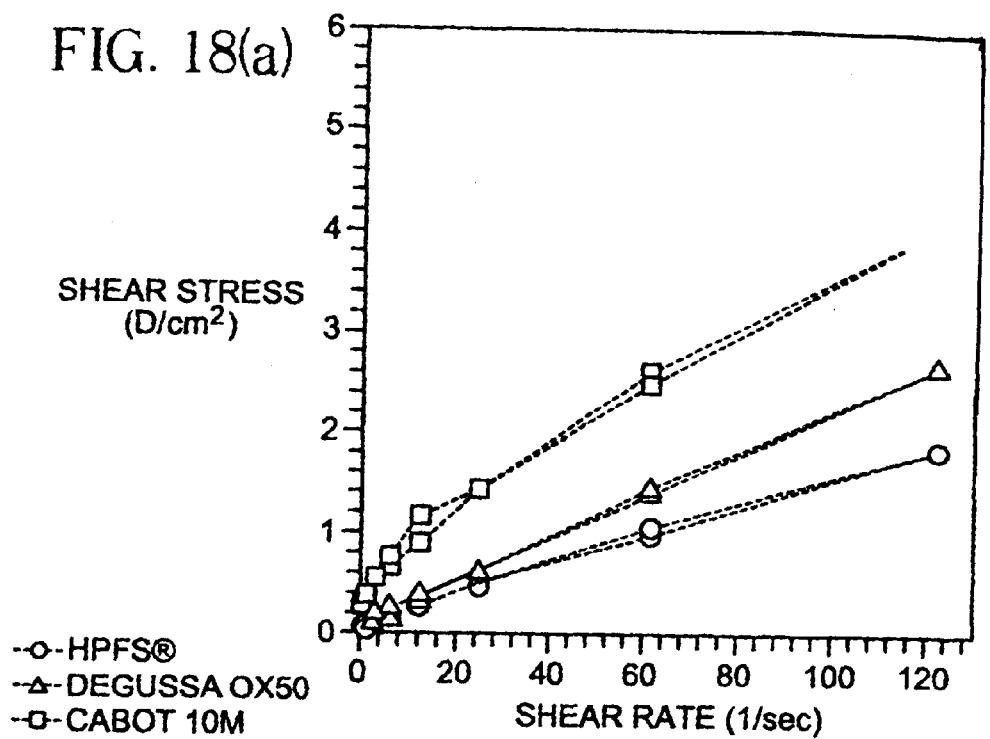
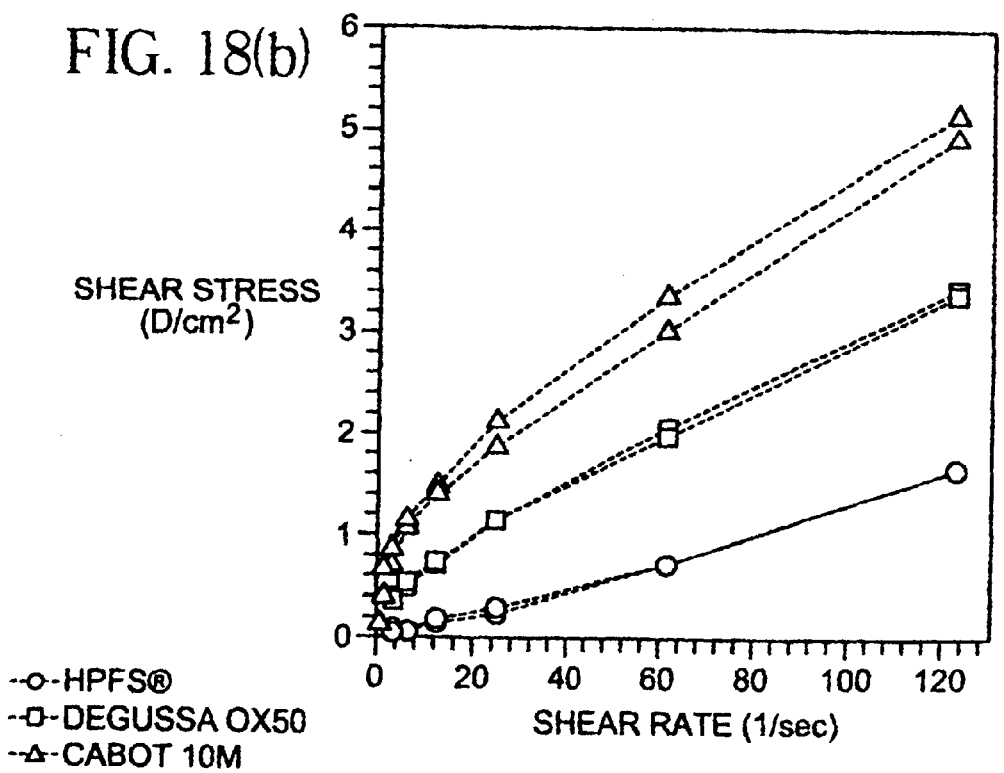

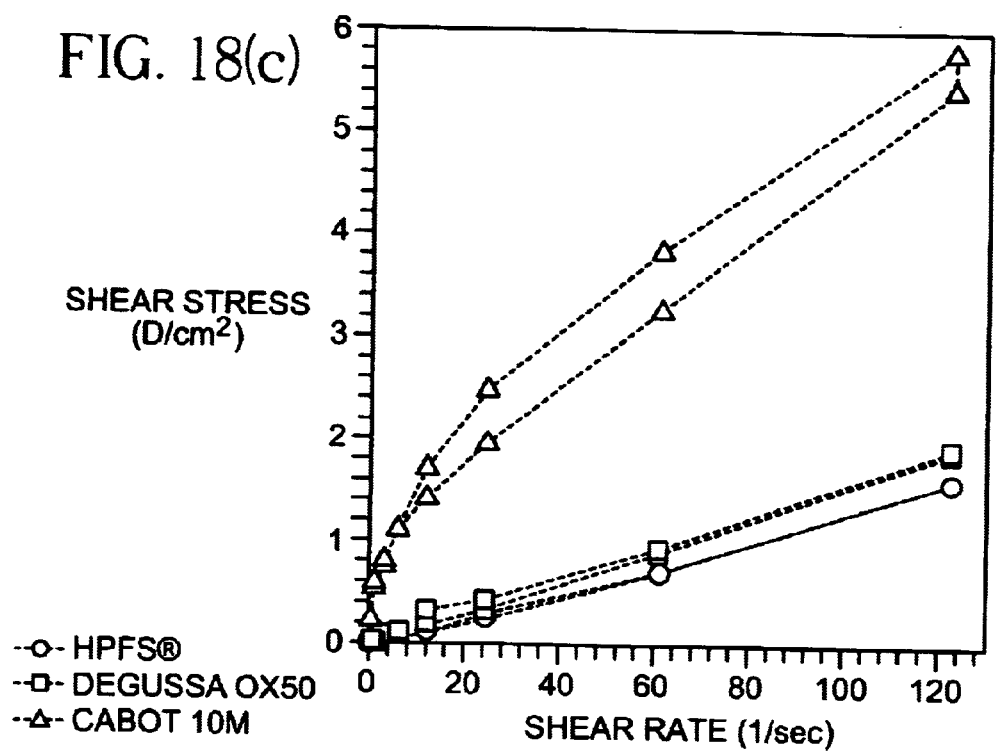
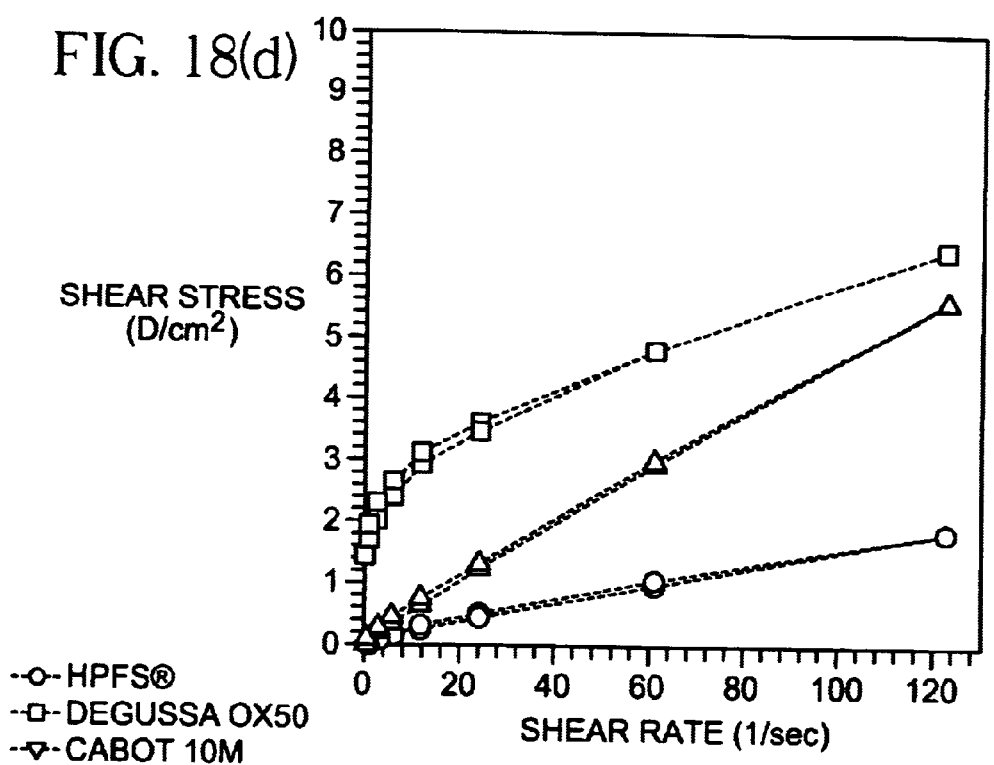

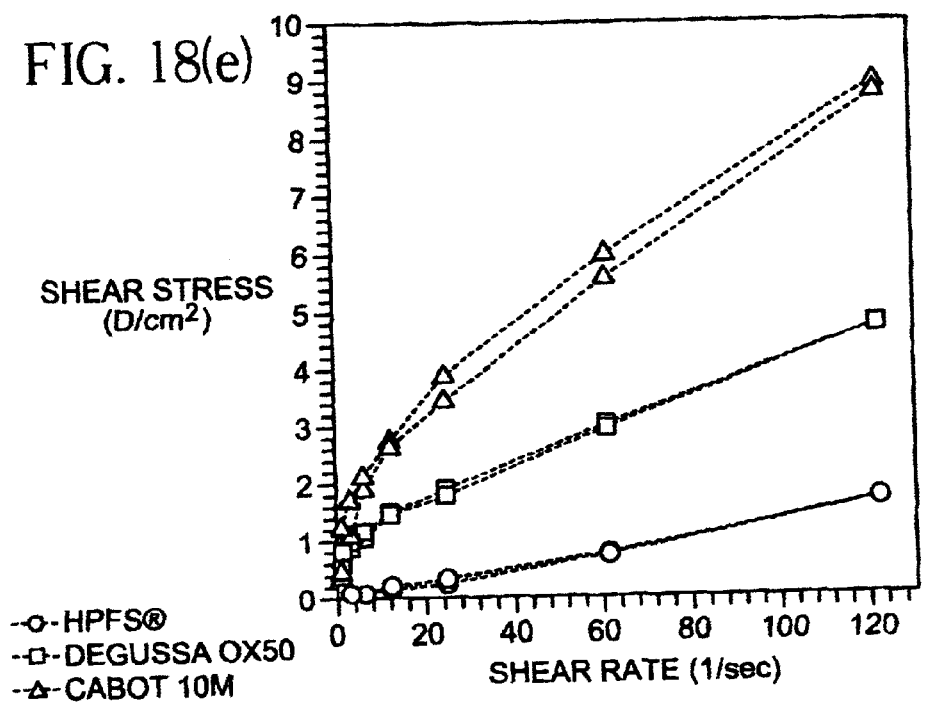
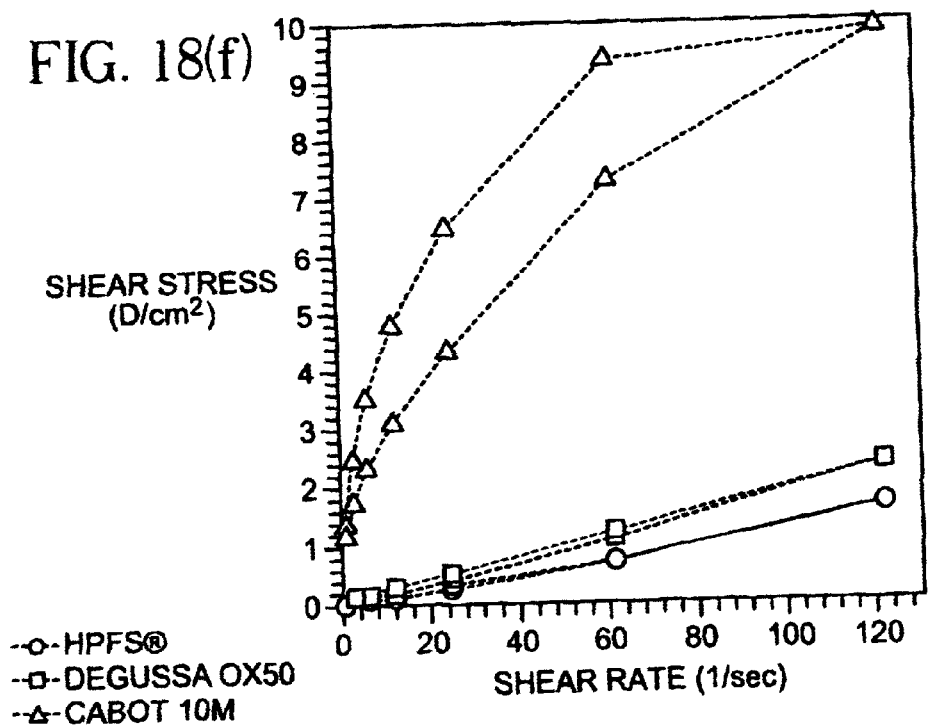

FIG. 19
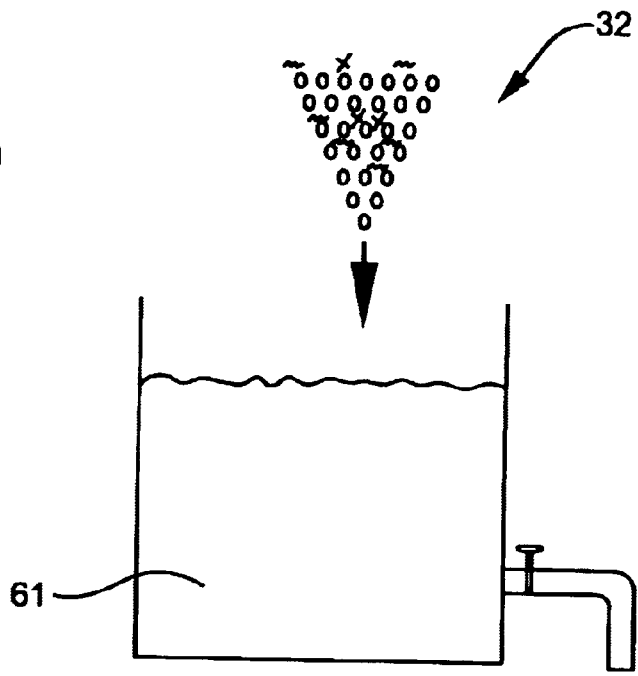
FIG. 20
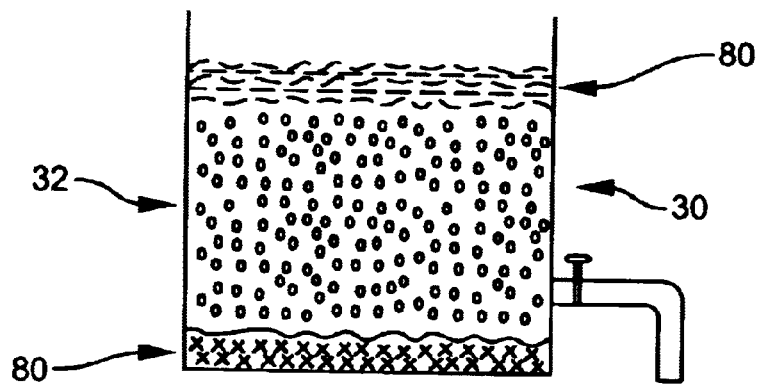
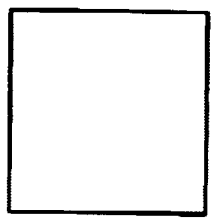

METHOD OF MAKING OPTICAL FLUORIDE LASER CRYSTAL COMPONENTS

FIELD OF THE INVENTION

The invention relates to optical fluoride crystals, and particularly to optical fluoride crystals, such as calcium fluoride, which have high transmission levels to below 300 nm light, such as produced by excimer lasers. In particular the invention relates to making optical fluoride crystalline laser components with improved flatness final polished surfaces. The invention relates to a calcium fluoride final polishing agent of colloidal silica soot. The invention also relates to a unique method of polishing fluoride crystal optical surfaces using fused silica soot.

BACKGROUND

Applications of colloidal suspensions for polishing materials has become an exceedingly critical aspect of the final part formation of optical components and blanks/preforms thereof. Silica and alumina colloids are formed through various techniques and typically require expensive precursor materials in order to ensure the highest purity products. Solutions are stabilized with buffer systems to pH and solids loading values that result in optimal surface finish attainment. Particle size distribution can be adjusted to control the final surface finish, as well as the ability to clean residue abrasive particles from workpiece surfaces after processing.

The level of final polish currently available is not good enough for optical fluoride crystalline laser components. Especially critical is that final polishing with present colloidal abrasive particles greatly degrades the flatness of the optical surface of the optical fluoride crystalline laser component being made and polished. Small surface imperfections easily distort the laser light to be manipulated by the crystal component and small particle size abrasives have a low long removal rate. Also, hard, optical quality pads scratch the surface when used with conventional non-spherical small particle size abrasives.

SUMMARY OF INVENTION

The invention includes a method of making optical fluoride crystal components, preferably optical fluoride crystal laser components and optical lithography systems such as utilized in below 200 nm excimer lasers and optical lithography systems. The method includes providing an optical fluoride crystal having an initial polish finished surface with an initial finish surface roughness greater than 1 nm RMS and an initial finish flatness, providing an optical fluoride crystal final polishing solution, said final polishing solution comprised of a plurality of particulate abrasive agent colloidal silica soot, and polishing with said provided optical fluoride crystal final polishing solution said provided optical fluoride crystal initial polish finished surface to a final polished surface having a reduction in flatness no greater than 50% of said initial finish flatness, and said final polished surface having a final polished surface roughness less than 1 nm RMS. The invention provides a beneficial final polish of 0.5 nm RMS or better to a fluoride crystal that has an initial polished surface less than 5 nm RMS. The polishing solution can be aqueous, preferably in the pH range of 2–12, and more preferably 9–12. In an alternative embodiment the polishing solution is non-aqueous, such as based on ethylene glycol or kerosene. The spherical soot particles provide beneficial polishing of fluoride crystal with little to no scratching and a finer surface finish. The soot particle polish provides better retention of form and figure, and particularly flatness for flat surface optical elements such as laser components, with the belief that the soot particles form a beneficial polishing barrier (due to particle size and size distribution) between the fluoride crystal surface and the polishing pad utilized in the polishing of the fluoride crystal surface. The soot particle polish is preferably applied with a synthetic polishing pad, with the soot providing improved removal rates and preventing damage from polishing pad contact with the fluoride crystal surface, preferably with the soot particles filling the pad pores to form a surface of spherical soot particles that the crystal surface is abraded against.

The invention includes a method of polishing an optical fluoride single crystal, preferably a calcium fluoride single crystal. The method includes providing an optical fluoride crystal having an optical transmission surface, providing a final polishing fused silica soot solution, said final polishing solution comprised of a plurality of particulate abrasive agent colloidal solid sphere fused silica soot particles, and polishing said optical fluoride crystal optical transmission surface with said final polishing colloidal solid sphere fused silica soot solution to provide a polished optical fluoride crystal optical transmission surface.

The invention includes a method of making an optical fluoride crystal polishing slurry. The method includes providing a plurality of particulate abrasive agent solid sphere fused silica soot particles, providing an optical fluoride crystal polishing pre-slurry solvent, dispersing said particulate abrasive agent colloidal solid sphere fused silica soot particles in said optical fluoride crystal polishing pre-slurry solvent to form an optical fluoride crystal polishing slurry. The invention includes an optical fluoride crystal polishing slurry and an optical fluoride crystal final polishing particulate agent comprising colloidal silica soot having an average particle size ranging from above 50 nm to 500 nm, preferably an average particle size ranging from 100 nm to 400 nm, and more preferably an average particle size ranging from 250 nm to 350 nm. Preferably the colloidal silica soot has a spherical morphology and a specific surface area of 20 $m^2/g$ or less.

DESCRIPTION OF THE DRAWINGS

FIGS. 7–10 illustrate methods in accordance with the invention.

fused SiO$_2$ soot and (b) TiO$_2$—SiO$_2$ soot particles, and comparison of $^{29}$Si MAS NMR results for the (c) fused SiO$_2$ soot particles and annealed SiO$_2$ glass and for the (d) TiO$_2$—SiO$_2$ soot particles and annealed TiO$_2$—SiO$_2$ glass.

Figure 15:
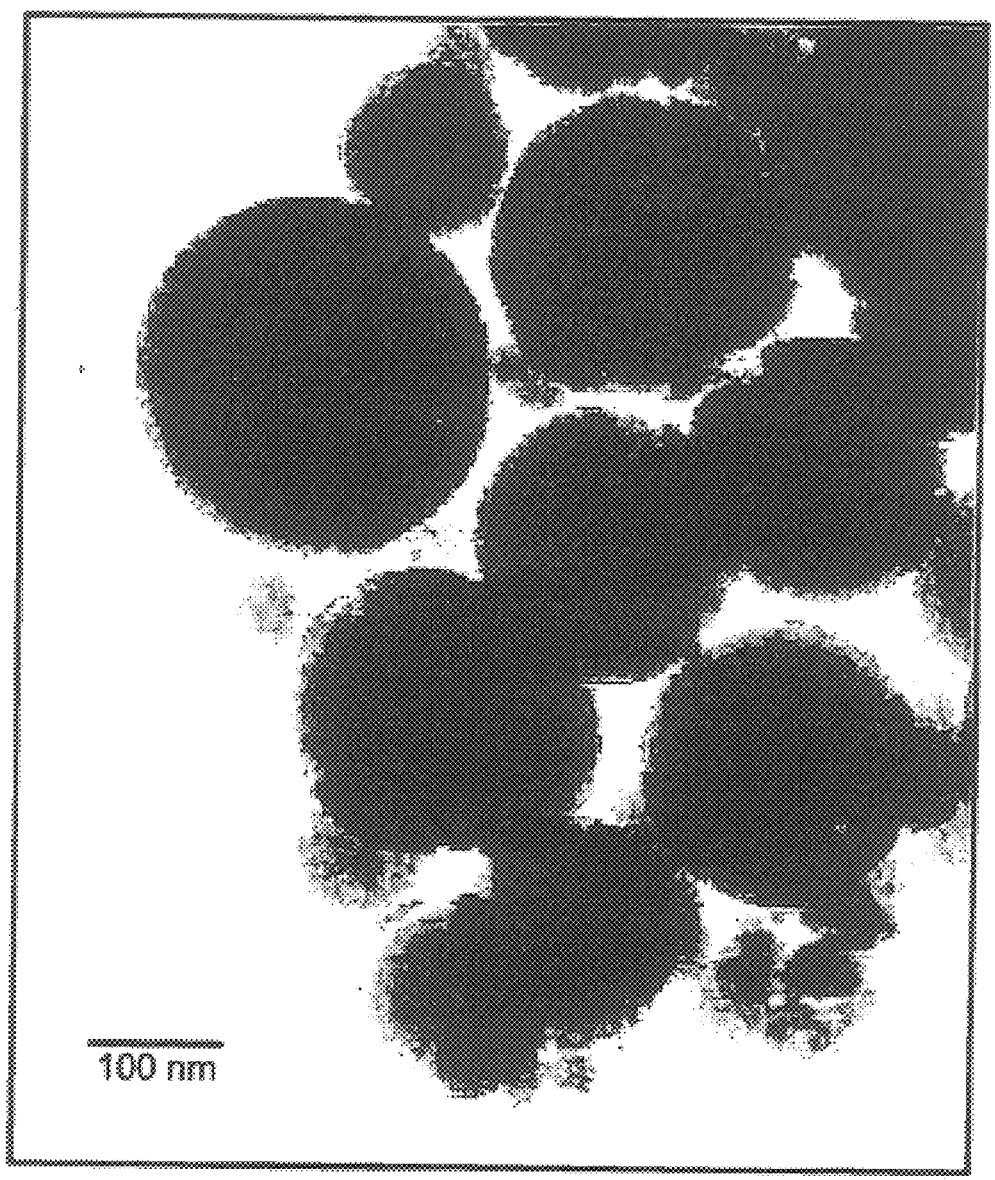

FIG. 15 is a photomicrograph of silica soot in accordance with the invention.

Figure 16:
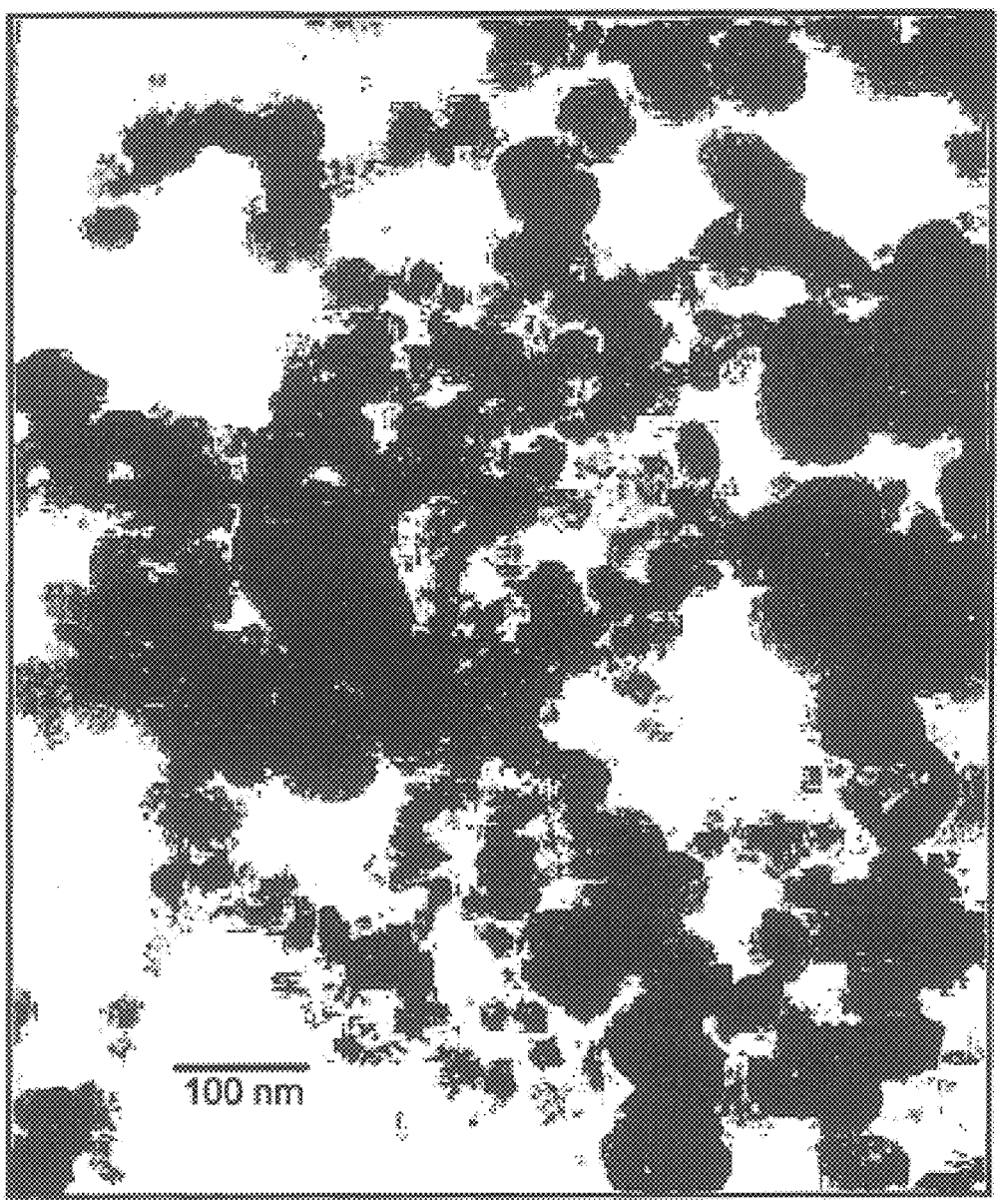

FIG. 16 is a photomicrograph of Degussa OX50 fumed silica.

Figure 17:
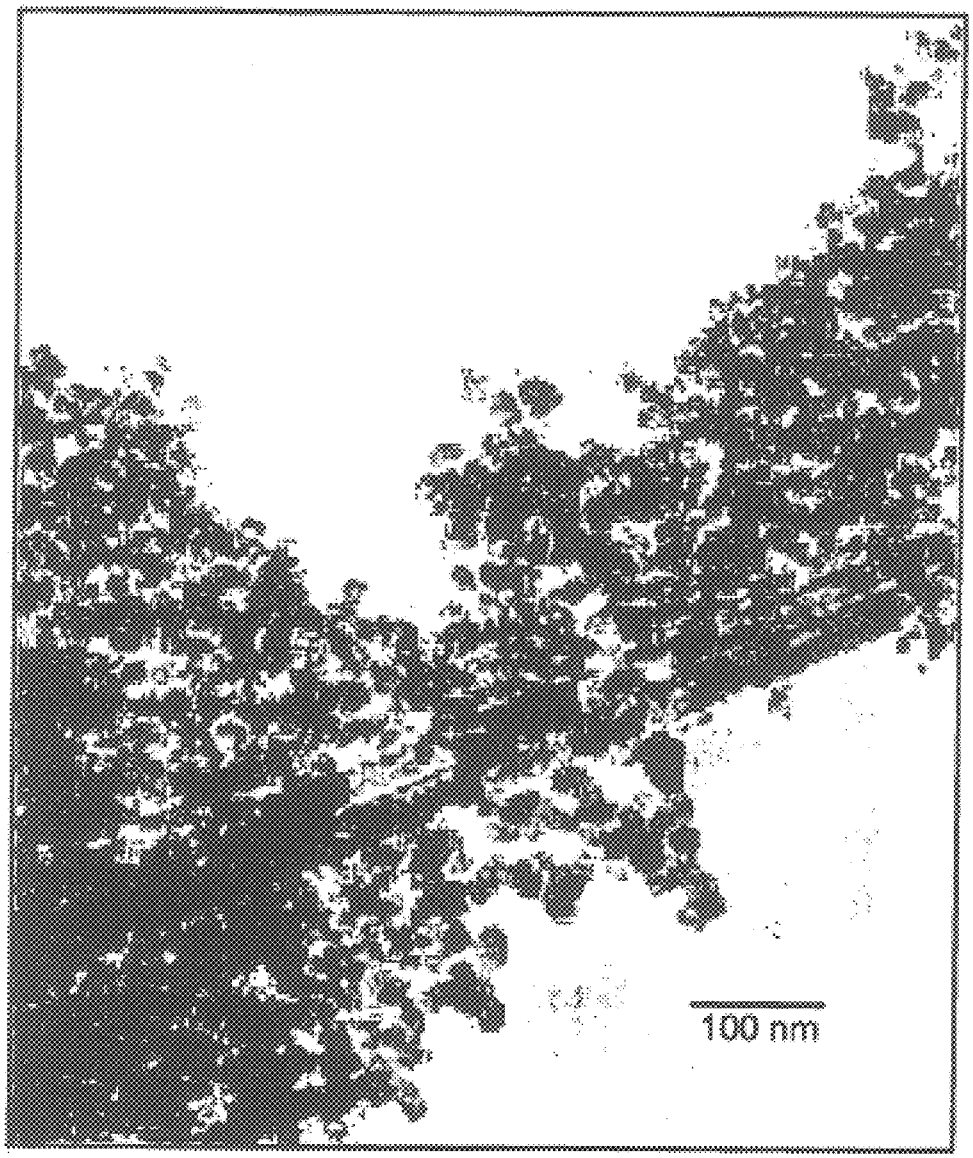

FIG. 17 is a photomicrograph of Cabot 10M fumed silica

FIGS. 18(a)–(f) are plots of shear rate (1/sec) vs. shear stress (D/cm$^2$).

Figure 21:
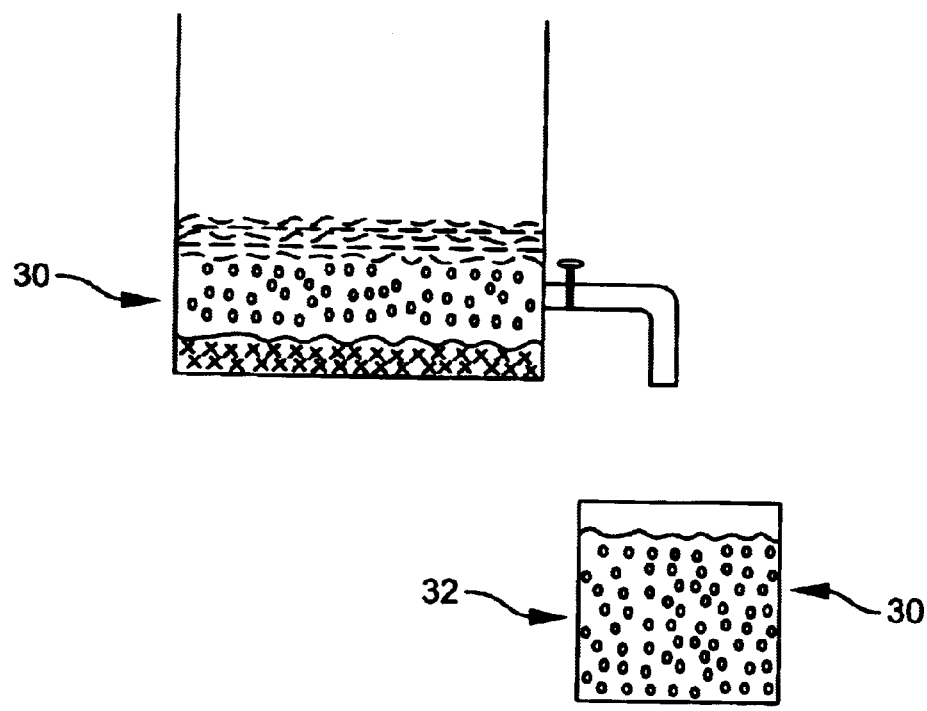

FIGS. 19–21 show methods in accordance with the invention.

DETAILED DESCRIPTION OF THE INVENTION

The invention includes a method of making optical fluoride crystal components. Preferably the invention comprises a method of making optical fluoride crystal laser components, most preferably calcium fluoride optical fluoride crystal laser components. In preferred embodiments the inventive method includes making calcium fluoride optical crystal laser components having a flat optical transmission surface such as prisms, beam expanders, output couplers, and windows.

Figure 1:
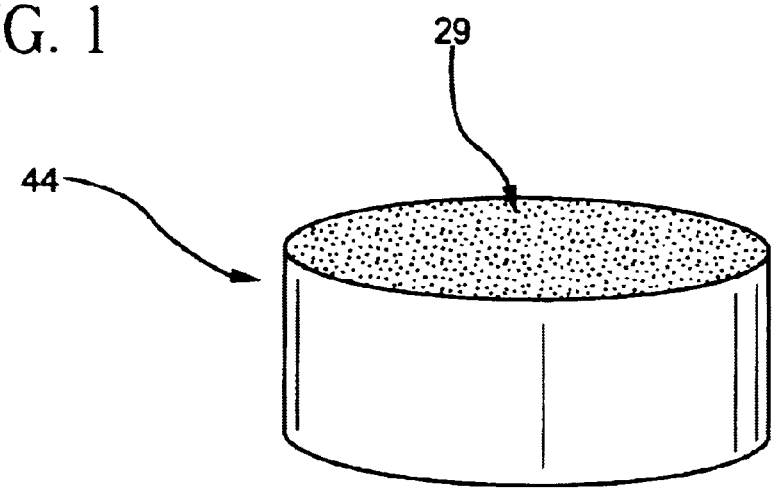
FIGS. 1–5 illustrate methods in accordance with the invention.
Figure 2:
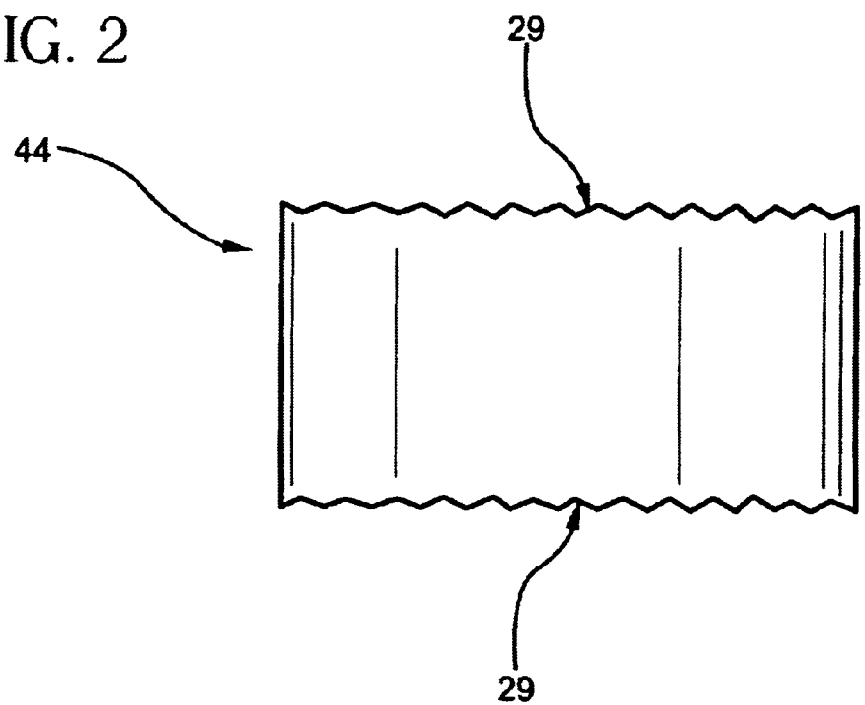
Figure 3:
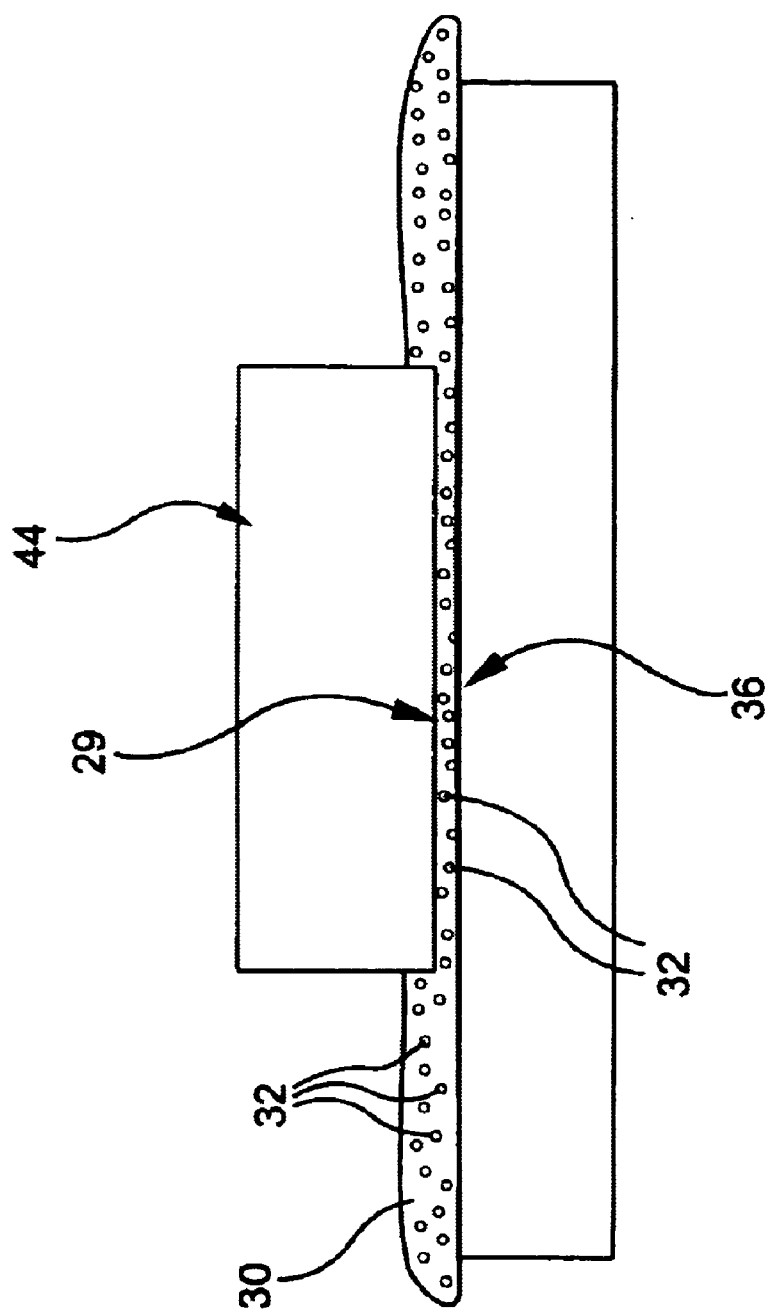
Figure 4:
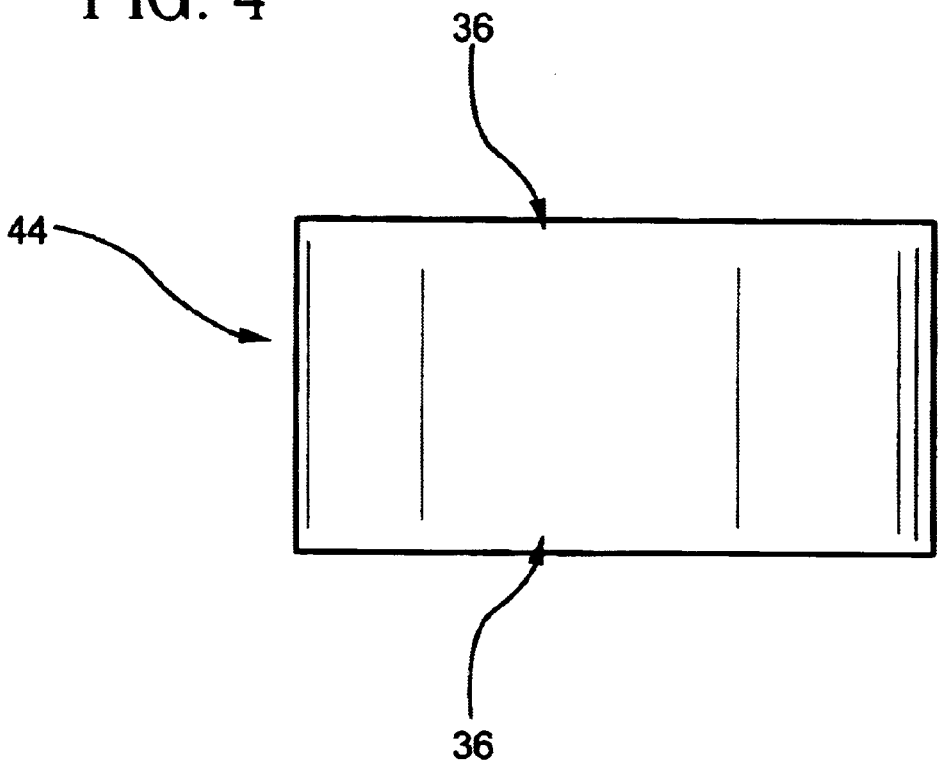
Figure 5:
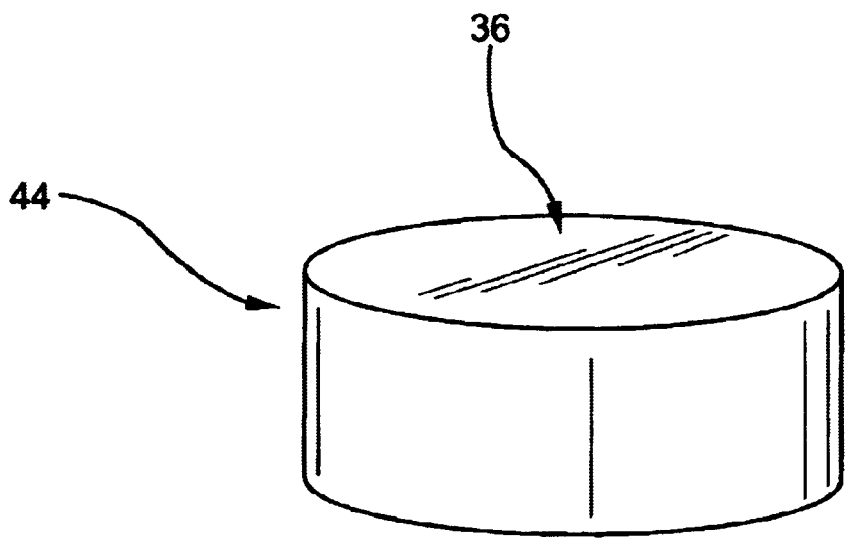

The method of making optical fluoride crystal components includes providing an optical fluoride crystal having an initial polish finished surface with an initial finish surface roughness greater than 1 nm RMS and an initial finish flatness, providing an optical fluoride crystal final polishing solution, said final polishing solution comprised of a plurality of particulate abrasive agent colloidal silica soot, and polishing with the provided optical fluoride crystal final polishing solution the provided optical fluoride crystal initial polish finished surface to a final polished surface having a reduction in flatness no greater than 50% of said initial finish flatness and with the final polished surface having a final polished surface roughness less than 1 nm RMS. As shown in FIGS. 1–2, the invention includes providing optical fluoride crystal 44, preferably with crystal 44 being a single crystal of calcium fluoride. Optical fluoride crystal 44 has an initial polish finished surface 29. As shown in FIGS. 3–7, the method includes providing an optical fluoride crystal final polishing solution 30 with final polishing solution 30 comprised of a plurality of particulate abrasive agent colloidal silica soot 32. As shown in FIGS. 3–5 and 7 the method includes polishing with the provided optical fluoride crystal final polishing solution 30 the provided optical fluoride crystal initial polish finished surface 29 into a final polished surface 36. Final polished surface 36 has a final polished surface roughness less than 1 nm RMS with the final polished surface having a reduction in flatness no greater than 50% of said initial finish flatness of initial polish finished surface 29. Preferably providing optical fluoride crystal 44 having an initial polish finished surface 29 with an initial finish surface roughness greater than 1 nm RMS includes providing an optical fluoride crystal 44 having an initial polish finished surface 29 with an initial finish surface roughness no greater than about 5 nm RMS. Preferably polishing includes polishing to a final polished surface 36 having a final polished surface roughness less than 0.75 nm RMS, and more preferably a final polished surface roughness no greater than 0.5 nm RMS. Preferably polishing includes polishing to a final polished surface 36 having a reduction in flatness no greater than 30% of said initial finish flatness of surface 29, and more preferably no greater than 25% of said initial finish flatness of surface 29. Preferably, providing an optical fluoride crystal final polishing solution 30 of particulate abrasive agent colloidal silica soot 32 includes providing an optical fluoride crystal final polishing solution 30 comprised of a plurality of particulate abrasive agent colloidal solid sphere fused silica soot particles 32. Preferably, providing an optical fluoride crystal final polishing solution 30 of particulate abrasive agent colloidal silica soot 32 includes providing an optical fluoride crystal final polishing solution 30 comprised of colloidal solid sphere fused silica soot particles 32 having an average particle size ranging from above 50 nm to 500 nm. Preferably, providing an optical fluoride crystal final polishing solution 30 of particulate abrasive agent colloidal silica soot 32 includes providing an optical fluoride crystal final polishing solution 30 comprised of colloidal solid sphere fused silica soot particles 32 which have specific surface areas of 20 m$^2$/g or less.

Figure 6:
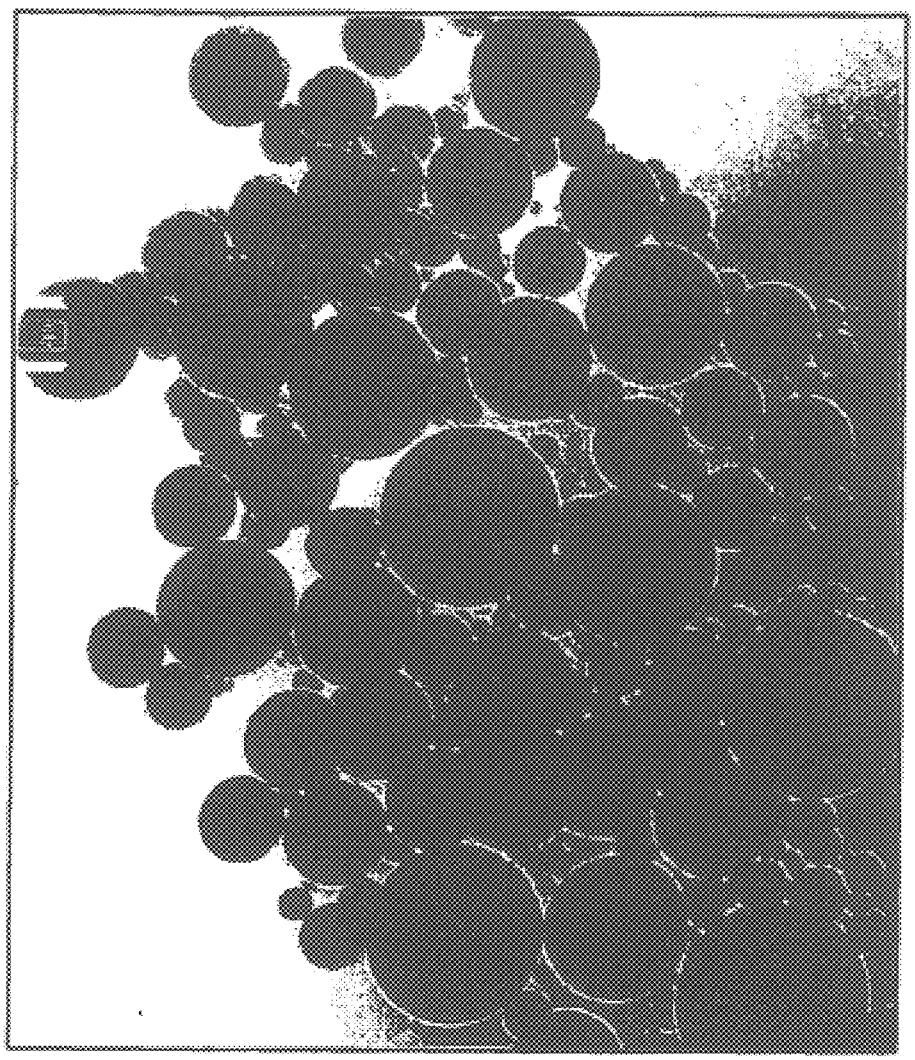
FIG. 6 is a photomicrograph of silica soot in accordance with the invention.
Figure 7:
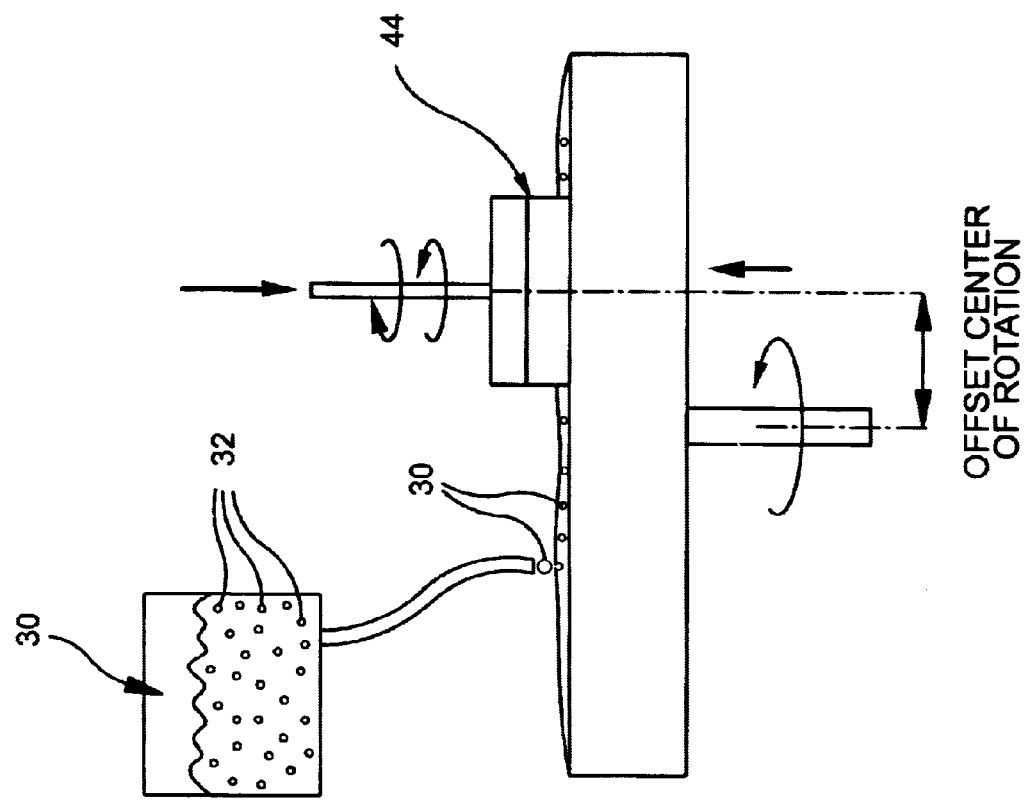

The particulate abrasive agent solid sphere fused silica soot 32 of the invention are shown in the transmission electron microscopic (TEM) image of FIG. 6. Solid sphere fused silica soot 32 are individual nonporous discrete fused glass spheres as contrasted with fumed silica particles [with fume silica particle being agglomerates (10–50 micrometers) of aggregates (100 to 500 nanometers) of primary particles (10 nanometers), with fume silica particles being open structured and macroporous with high specific surface areas, see The Product by Wacker, www.wacker.de/englishlhdk/produkt_e.htm, Oct. 5, 1999]. Solid sphere fused silica soot 32 is preferably produced during a glass manufacturing chemical vapor deposition process at high temperatures where the glass particles form discrete separate individual glass soot spheres. Preferably solid sphere fused silica soot 32 is a byproduct of a glass manufacturing chemical vapor deposition process wherein the soot 32 is the escaped soot that avoids its intended deposition surface and escapes from the glass manufacturing process as an exhausted particulate pollutant byproduct in the glass furnace exhaust. The formation of high purity fused silica soot is generated by high temperature flame hydrolysis or flame combustion processes. High purity silicon containing chemical feedstock is introduced into an oxygen-hydrocarbon, or oxygen-hydrogen flame, to generate silica intermediates preferably in an insulated enclosure which is maintained at temperatures above 1300° C. The silica intermediates include "seeds" of solid silicon dioxide in the nanometer size range, gaseous silicon monoxide, and other intermediate silicon containing compounds from the flame hydrolysis or flame combustion reactions. Preferably, the insulating enclosure is designed in such a way that the silica intermediates experience prolonged residence time under high temperature (>1300° C.) within the enclosure, during which the solid silicon dioxide "seeds" grow and sinter simultaneously at high temperature (preferably>than 1300° C.) to generate larger solid separate discrete individual sphere particles before exiting the enclosure. Titanium doped silica soot is a byproduct of Corning Incorporated's ultra low expansion (ULE™) glass making chemical vapor deposition process. It has similar characteristics to high purity fused silica soot produced by Corning Incorporated's high purity fused silica (HPFS™) glass except for its composition. As an alternative to solid sphere fused silica soot 32 being an exhausted byproduct from a glass making chemical vapor deposition process, soot 32 can be intentionally produced as described in pending U.S. patent application Ser. No. 09/458,898, filed Dec. 10, 1999, entitled Process For Producing Silica Soot, of Kar et al., incorporated herein by reference.

Providing slurry 30 with particulate abrasive agent colloidal silica soot 32 preferably includes providing soot particles 32 with a particle size >0.25 µm (250 nm). In a preferred embodiment, soot particles 32 have a particle size distribution between 30 nm and 300 nm. Soot 32 are spherical soot particles which are near perfectly spherical if not perfect spheres, with the spheres being non-agglomerated individual spheres, particularly in comparison to fumed silica particles which may have rounded shapes but are non-spherical in terms of the macroparticle shape profile. In a preferred embodiment, soot particles 32 are high purity fused silica soot particles, preferably which consist essentially of $SiO_2$. Preferably the high purity fused silica glass has an OH content by weight >500 ppm, preferably ≧800 ppm, preferably in the range of 800–1100 ppm, and an impurity level other than OH that is no greater than 1,000 ppb, preferably with a non-OH impurity level in the range of 100–1000 ppb, with the glass in a high purity bulk glass body state having high transmissions (>90%/cm) at UV wavelengths >200 nm. In an alternative preferred embodiment, soot particles 32 are doped fused silica glass particles 32 which are preferably Ti doped fused silica glass soot particles ($SiO_2$—$TiO_2$ glass), most preferably a Ti doped ultra low expansion glass with a CTE of 0±30 ppb/° C. from 5° to 35° C., such as Corning Incorporated ULE™ glass. Preferably the Ti doped soot 32 has a $TiO_2$ wt. %<10 wt. %, and more preferably is about 7 wt. % $TiO_2$ (7±1 wt. % $TiO_2$). In further embodiments soot particles 32 can be doped with other fused silica glass dopants, preferably fused silica glass dopants which change the refractive index of the fused silica glass. In a preferred embodiment the soot 32 is a fused silica glass doped with an optical waveguide dopant, preferably with the fused silica glass soot a byproduct of an optical waveguide glass chemical vapor deposition process. In an embodiment soot 32 is a Ge (germanium) doped fused silica glass soot. In a further embodiment soot 32 is an Al (aluminum) doped fused silica glass soot. In an embodiment soot 32 is a B (boron) doped fused silica glass soot. In an embodiment soot 32 is a P (phosphorus) doped fused silica glass soot. In a further embodiment soot 32 is an Er (erbium) doped fused silica glass soot. In an embodiment soot 32 is a Ce (cerium) doped fused silica glass. In a preferred embodiment soot 32 is doped with a lanthanide series metal of the Periodic Table of Elements. In a further embodiment soot 32 is a Zr doped fused silica glass.

Providing polishing solution 30 includes providing particulate abrasive agent colloidal silica particles 32 with a mean particle size in the range of 300 to 500 nm (0.3 to 0.5 µm). Preferably soot 32 have a particle surface area less than 100 $m^2$/gram, more preferably no greater than 50 $m^2$/gram, and most preferably no greater than 20 $m^2$/gram. In a preferred embodiment soot 32 has a particle surface area in the range of about 10 to 20 $m^2$/gram. Preferably the polishing solution 30 slurry has a stabilized dispersion viscosity. Preferably the soot 32 has a surface activity ≧$1.5\times10^{-5}$ moles/meter. In a preferred embodiment soot 32 is high purity fused silica and has an intrinsic $pK_{a1}$ of 0.0±0.2 and an intrinsic $pK_{a2}$ of 7.0±0.1, preferably fused silica soot 32 having an isoelectric point ($pH_{IEP}$) of about 3.5±0.1. In an alternative preferred embodiment, soot 32 is a doped fused silica glass soot, with the dopant raising or lowering the $pK_{a1}$ and $pK_{a2}$, and the $pH_{IEP}$ of the fused silica soot with an intrinsic $pK_{a1}$ of 0.0±0.1 and an intrinsic $pK_{a2}$ of 5.0±0.2, and preferably with a lowered isoelectric point ($pH_{IEP}$) of 2.5±0.1. Preferably Ti doped fused silica glass soot 32 has an increased insolution surface charge compared to that of high purity fused silica pure $SiO_2$ soot particles. Preferably Ti doped fused silica glass soot 32 has an increased slurry stability at low pH values <5.0 compared to that of high purity fused silica pure $SiO_2$ soot particles. Polishing solution 30 slurry with soot 32 has an insolution stability with soot particles 32 being agglomeration resistant, gellation resistant, and having a stabilized viscosity, particularly when compared to fumed silica particles. The slurry of polishing solution 30 is stable in that the slurry has Newtonian viscosity, little to no agglomeration, and little to no gellation, with loadings in slurry from 1 to 15 weight %, preferably with stability maintained above 3 wt. %. Fumed silica slurries become unstable and difficult to manage at loadings in slurry above 3 wt. %.

Figure 8:
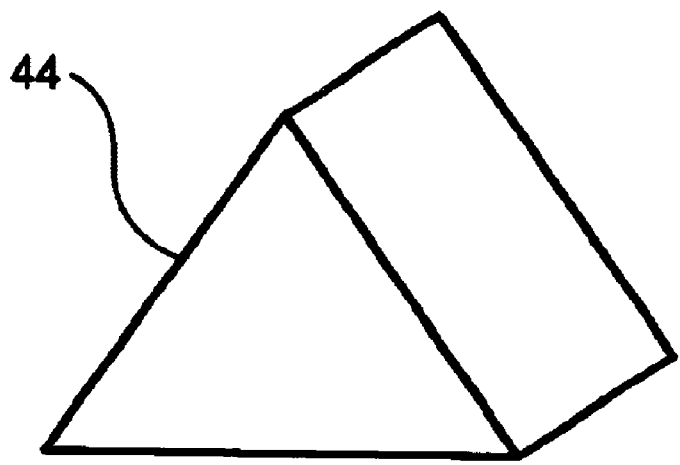
Figure 9:
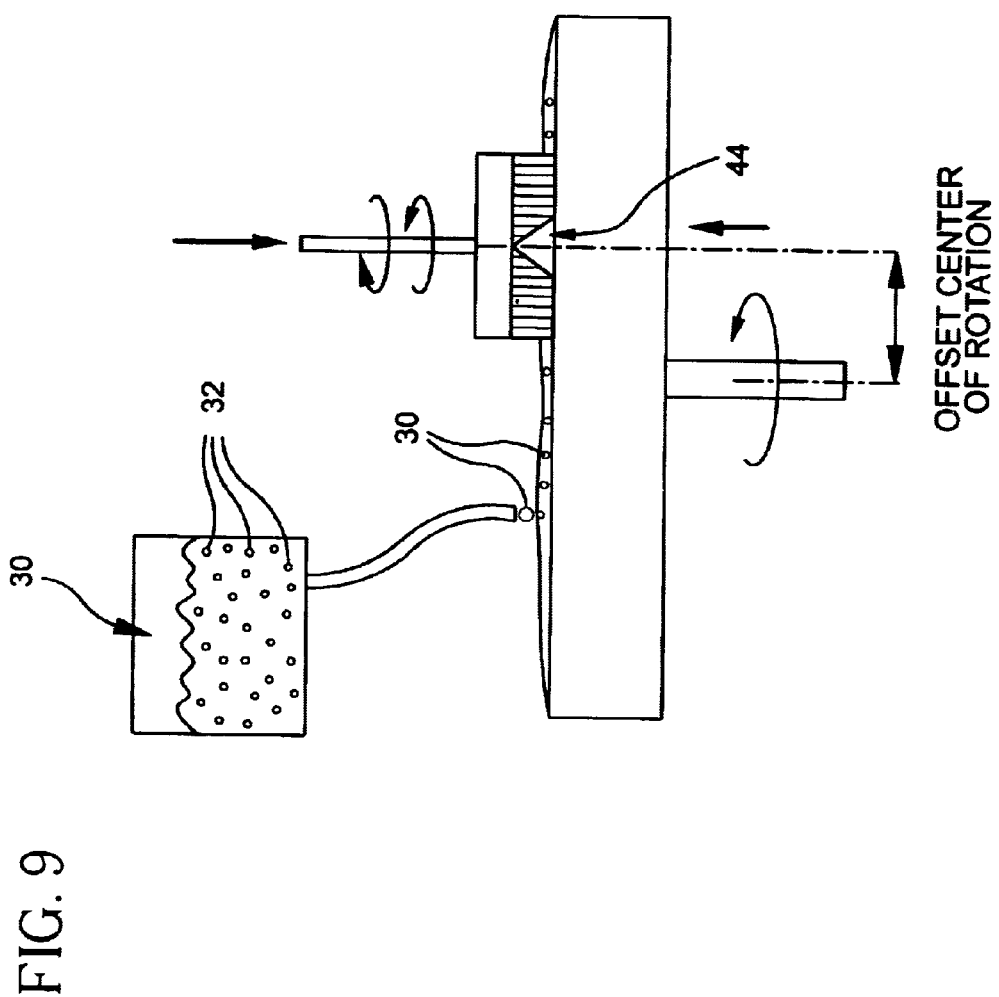

Preferably the method of making optical fluoride crystal components comprises making optical fluoride crystal laser components, most preferably excimer laser components having a flat optical transmission surface such as prisms, beam expanders, output couplers, and windows. Most preferably the invention includes making calcium fluoride optical fluoride crystal laser components. In an alternative embodiment the optical fluoride single crystal is a barium fluoride crystal. In an alternative embodiment the optical fluoride single crystal is a magnesium fluoride crystal. In an alternative embodiment the optical fluoride single crystal is a lithium fluoride crystal. As shown in FIGS. 8–10 the inventive method preferably includes making a optical fluoride crystal prism, most preferably a calcium fluoride optical fluoride crystal laser component prism, such as used in an excimer laser line narrowing package. In preferred embodiments the inventive method includes making calcium fluoride optical fluoride crystal laser components having a flat optical transmission surface such as prisms, beam expanders, output couplers, and windows, which can be utilized in below 200 nm wavelength lasers such as excimer lasers.

The polishing solution 30 of the invention with soot particles 32 has a stabilized dispersion viscosity. Preferably the polishing solution 30 is a slurry, most preferably an aqueous slurry. Preferably the soot of the inventive slurry has a surface activity ≧$1.5\times10^{-5}$ moles/meter. In a preferred embodiment the polishing solution slurry 30 is comprised of soot particles which have an intrinsic $pK_{a1}$ of 0.0±0.2 and intrinsic $pK_{a2}$ of 7.0±0.1. In this embodiment the soot particles preferably have an isoelectric point of 3.5±0.1. In an alternative embodiment soot particles 32 have intrinsic $pK_{a1}$ of 0.0±0.1 and intrinsic $pK_{a2}$ of 5.0±0.2. In this embodiment the soot particles preferably have an isoelectric point of 2.5±0.1. In an embodiment of the invention the soot particles are coated with cerium, iron, zirconium, aluminum, or oxides formed thereof. In a preferred embodiment of the slurry soot 32 is a Ti doped fused silica glass soot with an increased insolution charge. Preferably the Ti doped fused silica glass soot has an increased low pH stability insolution at pH values less than 5.0. The slurry 30 has an insolution stability with soot particles 32 being agglomeration resistant, gellation resistant, wherein the slurry has the stabilized viscosity.

Surface charge of soot particles 32 contributes to the beneficial calcium fluoride final polishing properties of slurry 30. Unlike monomeric silica acid with a pKa of 9.8, glass surfaces can have variable pKa values as determined by extent of Si—O—Si bonding, composition, and structure. The surface charge, point of zero charge, and pKa's for high purity fused $SiO_2$ soot 32 and $TiO_2$—$SiO_2$ (~7 weight % $TiO_2$) soot 32 glasses is explained herein. Preferably, soot particles 32 are byproduct soot and have the same inherent physical and chemical properties as the parent glasses produced by the glass making process, since they are made in the same chemical vapor flame hydrolysis deposition process. Titration experiments performed in $10^{-1}$ to $10^{-5}$ M NaCl solutions revealed dissociation constants (i.e., intrinsic $pK_{a1}$ and $pK_{a2}$ values) of 0.0 . 0.2 and 7.0±0.1 respectively for the fused $SiO_2$ particles, and 0.0±0.1 and 5.0±0.2 respectively for the $TiO_2$—$SiO_2$ particles. Points of zero charge for each material were calculated as 3.5±0.1 and 2.5±0.1 for the fused $SiO_2$ and $TiO_2$—$SiO_2$ particles respectively. The role of the $TiO_2$ dopant in lowering point of zero charge and $pK_{a2}$ values is believed to be the result of four-fold coordination.

Surface chemistry of silica particles in aqueous systems, especially surface charge and reactivity, relate to the utility of the particles in planarizing applications. Surface chemistry is greatly affected by the method of particle preparation.

Figure 11A:
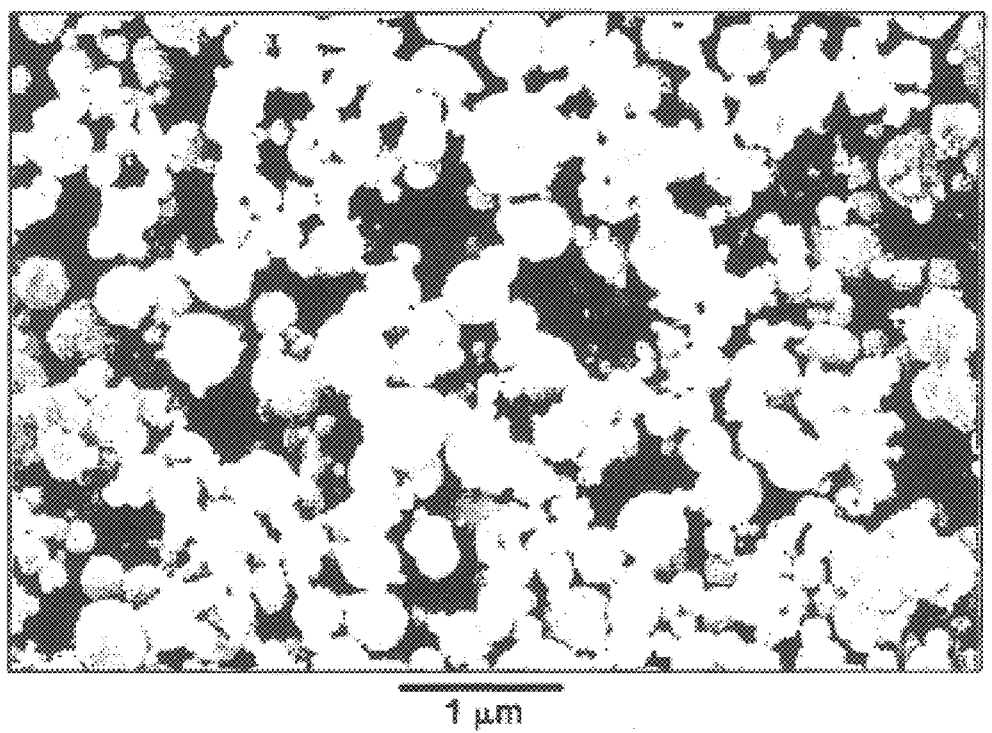
FIGS. 11(a)–(b) are photomicrographs of silica soot in accordance with the invention.
Figure 11B:
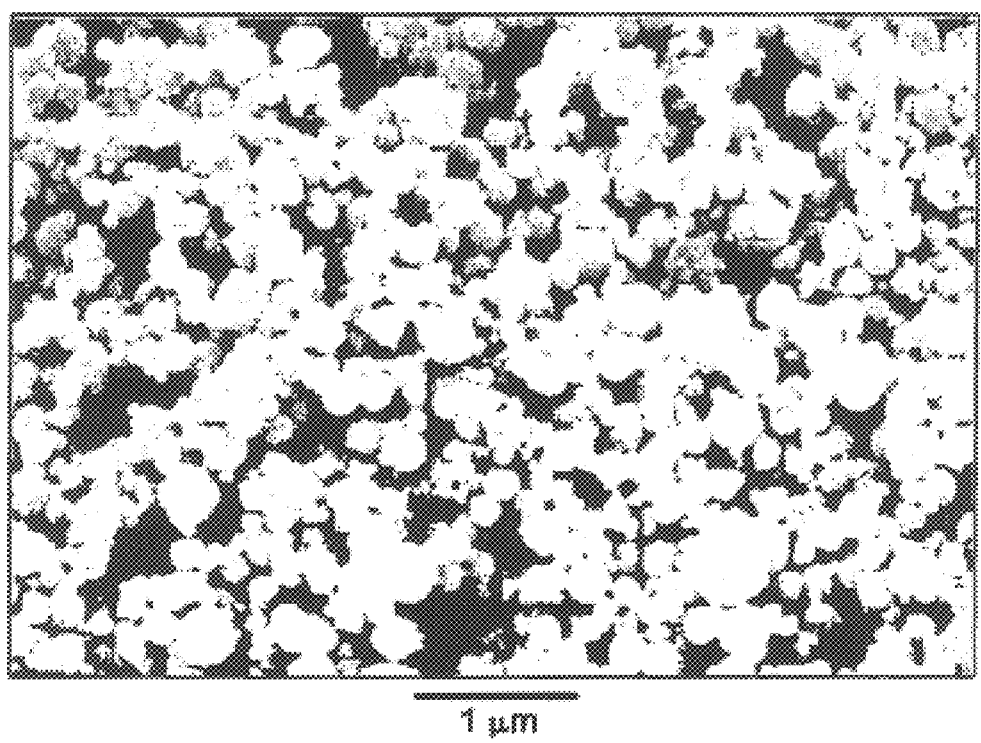

Soot particles 32 of the invention are utilized as soot particle glass in colloidal form. As can be seen in FIG. 11, soot particles are fully dense with smooth surfaces. FIG. 11(*a*) is a scanning electron micrograph of high purity fused silica soot and FIG. 11(*b*) is a scanning electron micrograph of Ti doped silica ($TiO_2$—$SiO_2$) soot particles.

Like other oxide surfaces in aqueous solutions, the silica soot 32 surface is OH terminated, amphoteric, and has a pH dependent surface charge. Surface charge and acidity of oxides are usually measured using acid-base titration of suspended oxide particles in aqueous suspensions.

Oxide surface can acquire either a positive or negative charge by association or dissociation of protons, e.g. for silica:

$$\equiv Si-OH + H^+ \leftrightarrows \equiv Si-OH_2^+ \quad (1)$$

$$\equiv Si-OH \leftrightarrows \equiv Si-O^- + H^+ \quad (2)$$

The acid-base behavior of an oxide surface is typically described by acidity constants $pK_{a1}$ and $pK_{a2}$, defined as:

$$K_{a1} = \frac{\{Si-OH\}[H^+]}{\{Si-OH_2^+\}} \quad (3)$$

$$K_{a2} = \frac{\{Si-O^-\}[H^+]}{\{Si-OH\}} \quad (4)$$

where { } denotes concentrations of surface species (mol/kg of adsorbing solid) and [ ] denotes the concentration of solute (M). Units for $K_{a1}$ and $K_{a2}$ are in moles per liter. The pH at which $\{Si-O-\}=\{Si-OH^{2+}\}$ is known as the point of zero charge (i.e., pHPZC) or isoelectric point if measured by electrophoresis. The $pH_{PZC}$ of either crystalline or amorphous $SiO_2$ ranges between 1 and 3, and the $pH_{PZC}$ of crystalline $TiO_2$ is between 3.5–5.5.

An acid-base titration method requires surface OH group concentration to be greater than approximately 0.1 mmol/L. Thus such method can be used with high surface area oxide powders but it cannot be used to titrate the surface of the glass. It is important to note that surface silanol ($\equiv Si-OH$) groups differ in acidity and that titration averages over all the sites.

The acidity of the silanol groups is dependent on the degree of condensation of silica. Monomeric silicic acid ($pK_{a2}$=9.8) has four —OH group coordination to Si, while a surface silanol group most commonly has Si coordinated by three —O—Si groups. The electronegativity of —O—Si groups is much greater than that of —OH. Therefore, the more OH groups of $Si(OH)_4$ are replaced by O—Si groups the more acidic the silanol group becomes. A surface silanol group is expected to be more acidic than silanol group of monomeric silicic acid because the surface silanol group is likely to have three —O—Si groups bonded to silicon rather than three OH groups that are coordinate to a silanol in monomeric silicic acid. Consequently, the $pK_{a2}$ of a soot surface is expected to be lower than the $pK_{a2}$ of monomeric silicic acid. Supporting this are acid-base titration results from Schindler and Kamber (Helvetica Chim Acta 51 (1968) 1781) that show the dissociation constant ($pK_{a2}$) for the surface silanol groups of a silica gel (fumed silica) to be 6.8±0.2.

The flame hydrolysis deposition (FHD) process used to manufacture fused SiO2 (Corning® HPFS® high purity fused silica glass) and the $TiO_2$—$SiO_2$ glass (Corning® ULE® ultra-low expansion glass) (Corning Codes 7980 and 7972 respectively) (Corning Incorporated, Corning, N.Y.) generates amorphous soot particles that are sintered into a boule (see FIG. 11 for electron micrographs of each powder of soot that was not deposited and exhausted as a byproduct). Soot particles 32 have the same composition and inherent physical and chemical properties as the glass to which they are sintered into. Exemplary compositions and properties for the $SiO_2$ and $TiO_2$—$SiO_2$ soots 32 are shown in Table I, along with the properties of the glasses made by consolidating the soots in the flame hydrolysis deposition. Both soot materials are of very high purity (>99.9%) (<0.1% contaminants) as determined via spectrographic and direct coupled plasma (DCP) analysis, and have similar surface areas. X-ray diffraction analysis on both soot powders did not detect any crystalline phases.

TABLE 1

Physical and chemical properties for the fused $SiO_2$ and $TiO_2$—$SiO_2$ glasses and corresponding soot particles. The parent glass codes are Corning 7980 and 7972 respectively.

| Property | Fused $SiO_2$ | $TiO_2$—$SiO_2$ |
|---|---|---|
| Composition (weight %) | | |
| Silica | 100% | 93% |
| Titania | 0% | 7% |
| Bulk Properties | | |
| Density (g/cc) | 2.20 | 2.21 |
| Elastic Modulus (GPa) | 73 | 68 |
| Knoops Hardness ($HK_{100}$) | 498 | 430 |
| Thermal Expansion, 0–300° C. ($\times 10^{-7}$/° C.) | 5.6 | 0.5 |
| Particulate Properties | | |
| Surface Area (m²/g) | 13.4 | 17.7 |

Total number of active surface OH sites of the two soots was measure using the fluoride adsorption method of Sigg and Stumm (Colloids and Surfaces, 2 (1980) 101). The soot 32 samples were dispersed into 0.12 M NaF solution at 10% solids loading. Solutions were adjusted with dilute HCl to pH 5.5±0.1, stirred at room temperature for 1 h, and placed into an oven at 50–55° C. for 1 h. The samples were then re-mixed, checked to confirm that pH had not deviated from 5.5±0.1, and fluoride content in solution was measured using a fluoride selective electrode by direct comparison to standards prepared from the initial 0.12 M NaF solution. The amount of fluoride adsorbed, which corresponds to the amount of surface active OH groups, was determined by the difference between fluoride added and fluoride left in the solution after equilibration. The correlation coefficient ($r^2$) for the sodium fluoride standards was >99.9%. Each experiment was run in duplicate.

Titration curves were generated for the $SiO_2$ and $TiO_2$—$SiO_2$ soot 32 using samples mixed to 10% solids loading in $10^{-1}$, $10^{-2}$, $10^{-3}$, $10^{-4}$, $10^{-5}$ M NaCl as background electrolyte. Each solution was first titrated to pH 7.5 using standardized 0.1 M NaOH, then immediately titrated below pH 2.0 using standardized 0.1 and 1.0 M HCl solutions, thus promoting particle dispersion by first titrating away from the isoelectric point.

Calculation of the intrinsic pKa values (i.e., dissociation constants) for each glass soot 32 powder was performed using the titration data, information on solids loading and surface activity, and by using the surface charge data for each of the glasses. The mean surface charge (Q) defined as the portion of the surface charge due strictly to [OH−] and [H+], was calculated for each solution in terms of surface species per gram (mol/g):

$$Q = \frac{C_a - C_b + [OH^-] - [H^+]}{a} \quad (5)$$

Ca and Cb correspond to the concentrations of acid and base used during titration respectively (mol/L), [ ]represent the concentrations of solute per unit volume (mol/L), and a is the quantity of oxide in solution (g/L). With the surface charge values (Q) and those values reported earlier for surface activities (S), pKa values were calculated for each titration curve using equations (6) and (7):

$$pK_{a1} = \frac{(S-Q) \cdot [H^+]}{Q} \quad \text{for } pH < pHPZC \quad (6)$$

$$pK_{a2} = \frac{Q \cdot [H^+]}{(S-Q)} \quad \text{for } pH > pHPZC \quad (7)$$

From the plot of $pK_{a1}$ and $pK_{a2}$ vs. surface charge (Q), the intrinsic pKa values were determined by extrapolating to zero surface charge.

Silicon-29 magic angle spinning (MAS) nuclear magnetic resonance (NMR) was performed on soot particles and on glasses made by direct deposition consolidation of each soot. Spectra were recorded at 99.28 MHz (11.7 Tesla), with 4 μm sec pulses using spinning rates of 5.0 kHz. Due to differences in relaxation times of the $^{29}$Si spins caused by higher OH content of the soot, recycle delays of 5000 and 300 sec were used for the glasses and soots, respectively. Spectra were referenced relative to external tetramethylsilane. 1H-$^{29}$Si cross-polarization (CP)/MAS NMR experiments were acquired only on soot samples using a contact time of 4.0 ms, recycle time of 10 s, and spinning rates of 3.33 kHz. Approximately 8000 scans were acquired for each spectrum.

Results for total number of surface active silanol groups {Si—OH} determined by fluoride adsorption for each soot powder are shown in Table II. For the SiO$_2$ soot 32 the total number of surface active silanol groups was $4.2 \times 10^{-4}$ mol/g. The TiO$_2$—SiO$_2$ soot 32 had a higher number of surface active sites per gram ($5.0 \times 10^{-4}$ mol/g), where those sites may correspond to both Si—OH and Ti—OH surface groups. However, to relate surface activities to the inherent chemistry of each material, differences in surface areas between the two soot particles (Table I) were accounted for by converting surface activities into units of mol/m$^2$, for which the fused SiO$_2$ soot ($3.1 \times 10^{-5}$ mol/m$^2$) had a higher surface activity than the TiO$_2$—SiO$_2$ soot ($2.8 \times 10^{-5}$ mol/m$^2$).

TABLE II

Surface properties determined via fluoride adsorption and acid-base titration for fused SiO$_2$ and TiO$_2$—SiO$_2$ soot particles.

| Property | Fused SiO$_2$ | TiO$_2$—SiO$_2$ glass |
|---|---|---|
| Surface Activity | | |
| (moles/gram) | $4.2 \times 10^{-4}$ | $5.0 \times 10^{-4}$ |
| (moles/meter$^2$) | $3.1 \times 10^{-5}$ | $2.8 \times 10^{-5}$ |
| Intrinsic pK$_{a1}$ | 0.0 ± 0.2 | 0.0 ± 0.1 |
| Intrinsic pK$_{a2}$ | 7.0 ± 0.1 | 5.0 ± 0.2 |
| Isoelectric Point (pH$_{IEP}$) | 3.5 ± 0.1 | 2.5 ± 0.1 |

Figure 12A:
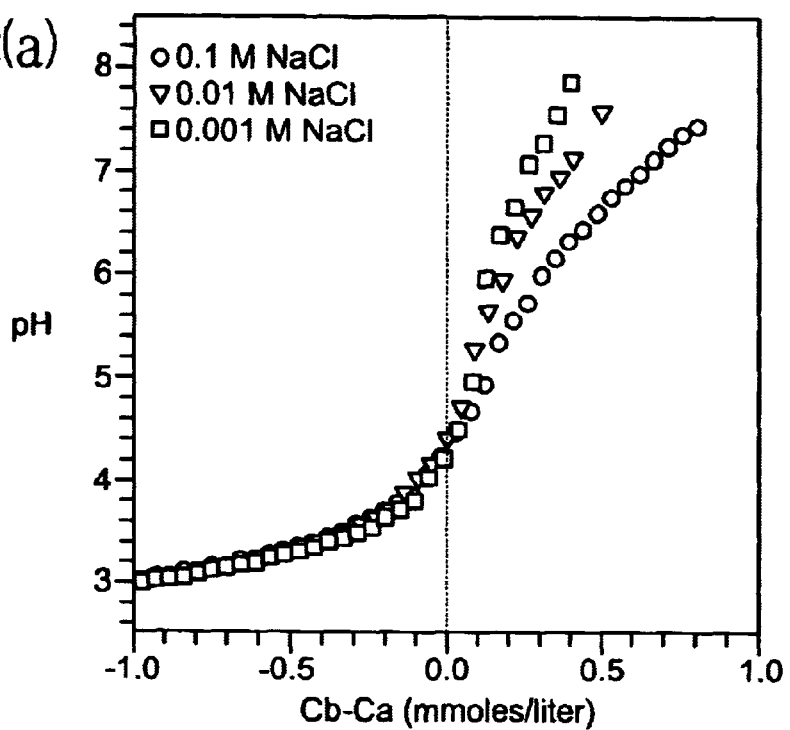
FIGS. 12(a)–(c) are titration results for the fused $SiO_2$ soot particles in $10^{-1}$, $10^{-2}$ and $10^{-3}$ M NaCl, plotted in terms of (a) acid-base titration, (b) surface charge calculated from titration data, and (c) acidity constants calculated from (a) and (b).
Figure 12B:
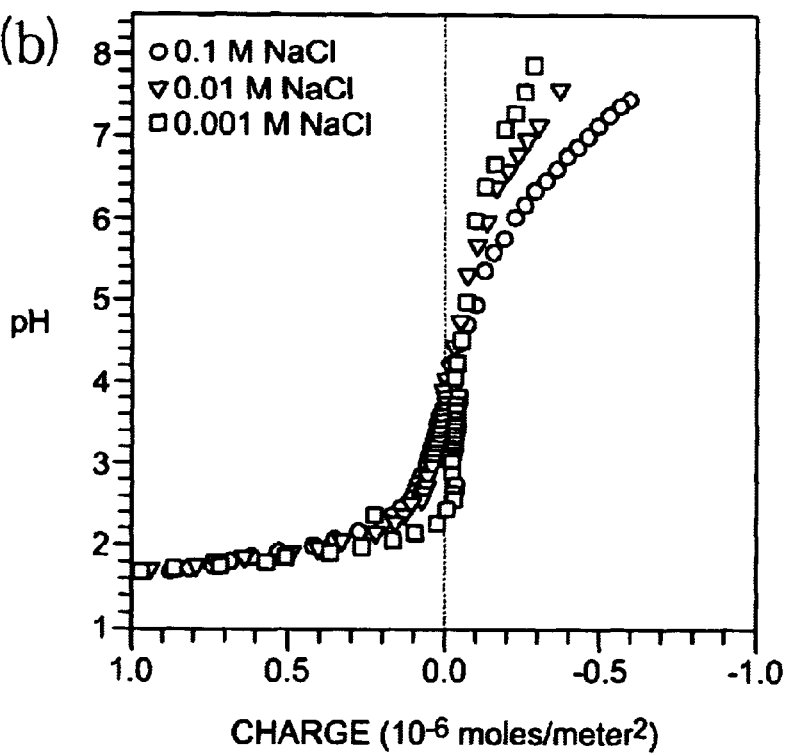
Figure 12C:
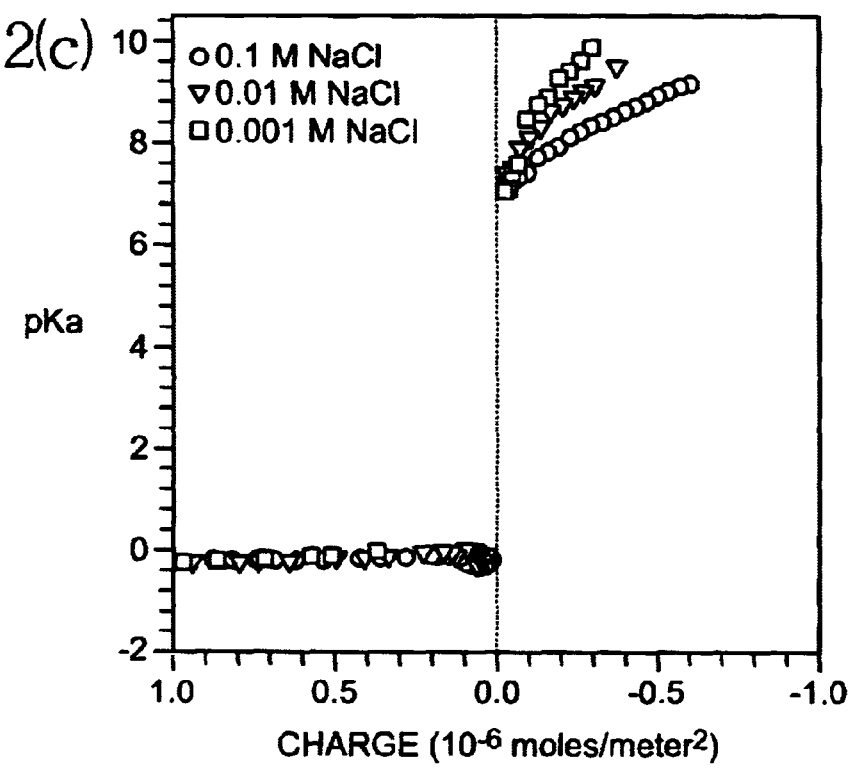
Figure 13A:
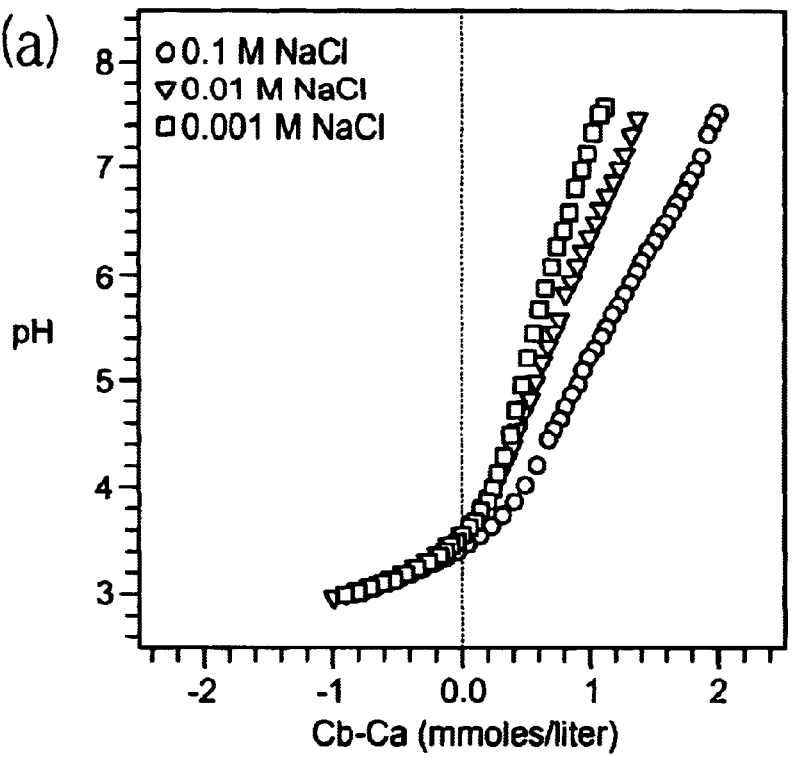
FIGS. 13(a)–(c) are titration results for the $TiO_2$—$SiO_2$ soot particles in $10^{-1}$, $10^{-2}$ and $10^{-3}$ M NaCl, plotted in terms of (a) acid-base titration, (b) surface charge calculated from titration data, and (c) acidity constants calculated from (a) and (b).
Figure 13B:
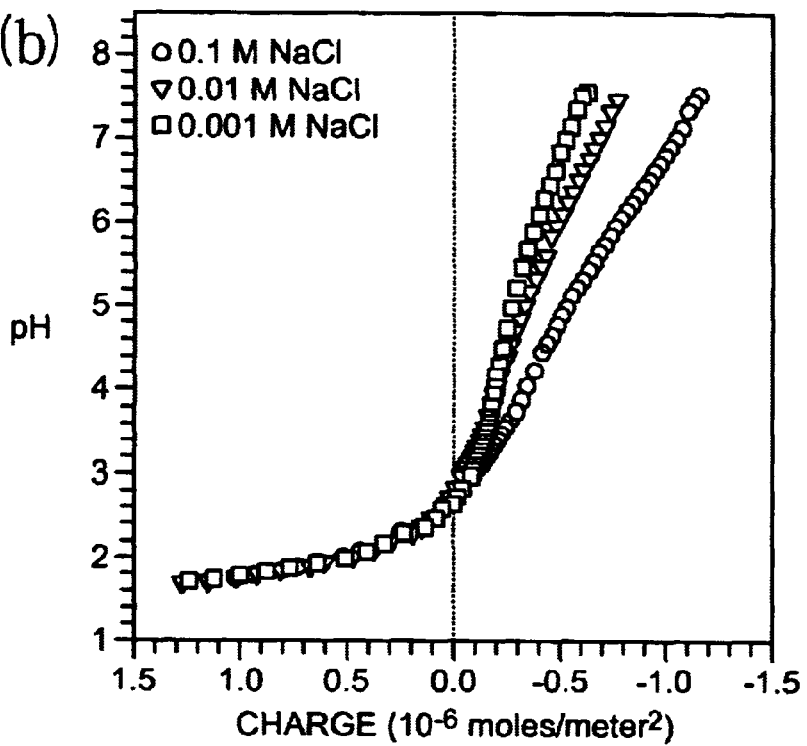

Acid-base titration curves and surface charge balanced titration plots are shown for the fused SiO$_2$ and TiO$_2$—SiO$_2$ soot 32 materials in FIG. 12 and FIG. 13, respectively. For each soot material, titration curves for different concentrations of inert electrolyte (i.e., NaCl) are shown to intersect at the point of zero charge, demonstrating the consistent behavior of both materials with respect to purity and surface charge behavior. For the fused SiO$_2$ soot (FIG. 12(b)), surface charge approached zero at pH 4.0 and remained at zero until titration below pH 3.0. This behavior commonly observed when silica is titrated has been attributed to the flocculation of silica due to the lack of electrostatic stabilization caused by low surface charge. The fact that this behavior was particularly significant for the low ionic strength solutions with the fused SiO$_2$ soot (see the $10^{-3}$ M NaCl curve in FIG. 12(b)) where the surface charge is low confirms that flocculation is most likely occurring. In comparison, the TiO$_2$—SiO$_2$ soot titrated to zero charge values at pH 2.6±0.2 and did not exhibit a lag at zero charge (see FIG. 13(b)).

Figure 13C:
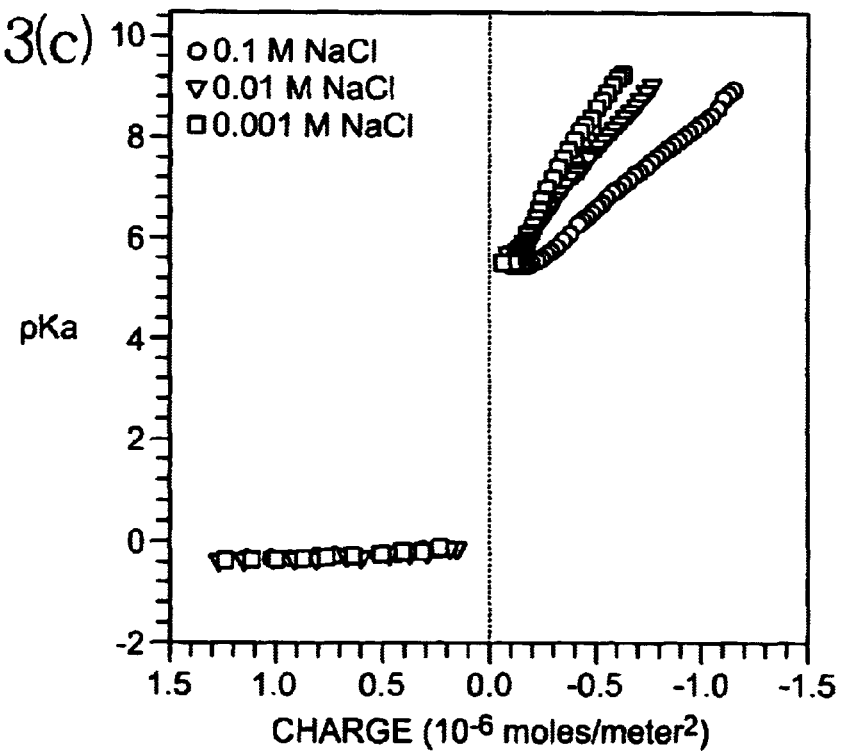

Results for the dissociation constants calculated for each soot are graphically shown in FIG. 12(c) and FIG. 13(c) and listed in Table II. The fused SiO$_2$ soot 32 was found to have intrinsic pK$_{a1}$ and pK$_{a2}$ values of 0.0±0.2 and 7.0±0.1 respectively. The TiO$_2$—SiO$_2$ soot 32 was found to have intrinsic pK$_{a1}$ and pK$_{a2}$ values of 0.0±0.1 and 5.0±0.2 respectively. The lower pK$_{a2}$ of the TiO$_2$—SiO$_2$ soot indicates that this soot is more acidic than the SiO$_2$ soot 32. The difference in NaCl concentrations over the range of $10^{-1}$ to $10^{-5}$ M did not altar results for each value, thus reflecting the consistency of each experiment.

Because of the difficulty of reading the pH$_{PZC}$ from the titration plots, especially for the SiO$_2$ soot where the surface has a charge close to zero over a wide range of pH, pH$_{PZC}$ was calculated from pKa's using the following relationship:

$$pH_{PZC} = \frac{(pK_{a1} + pK_{a2})}{2} \quad (8)$$

As such, the pH$_{PZC}$ values for SiO$_2$ and TiO$_2$—SiO$_2$ soot particles were determined to be 3.5±0.1 and 2.5±0.1 respectively. The TiO$_2$ doping of SiO$_2$ soot increases surface acidity.

Figure 14A:
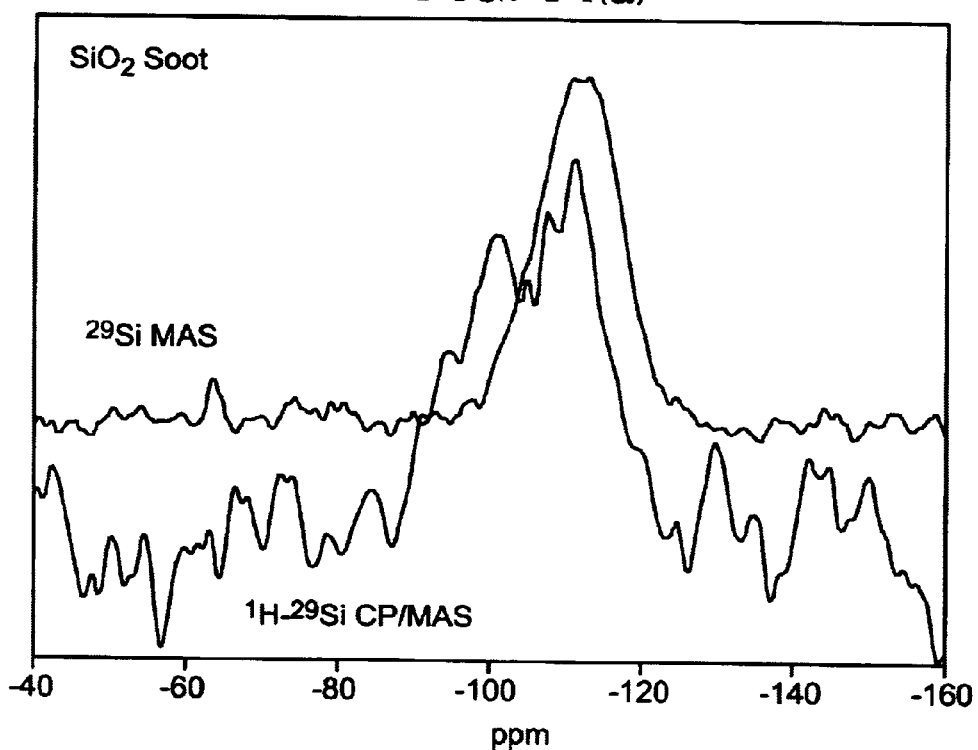
FIGS. 14(a)–(d) are comparison of $^{29}Si$ magic angle spinning (MAS) nuclear magnetic resonance (NMR) and $^1H$—$^{29}Si$ cross-polarization (CP)/MAS NMR results for (a)
Figure 14B:
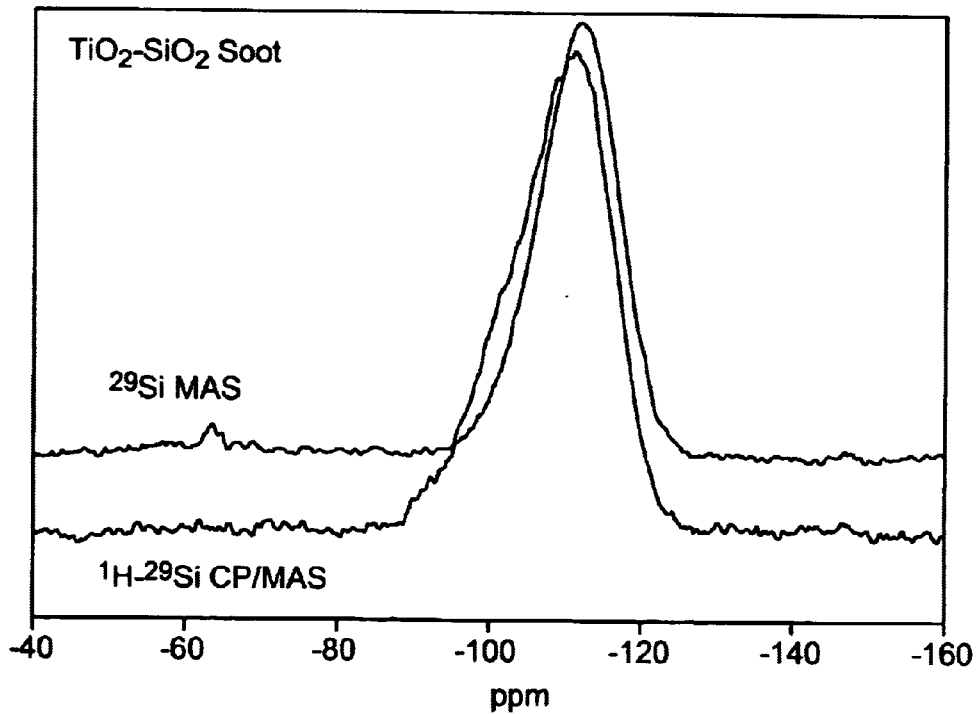

A comparison of $^{29}$Si MAS and 1H—$^{29}$Si CP/MAS spectra of the two soots 32 is presented in FIGS. 14(a) and (b). The CP/MAS spectrum of the TiO$_2$—SiO$_2$ soot has a much higher signal-to-noise ratio than the corresponding SiO$_2$ soot spectrum. The signal in the CP/MAS spectrum is generated by direct cross-polarization from 1H to $^{29}$Si, and only Si species with protons in the vicinity (such as Si—OH) give strong signal. The stronger CP/MAS signal in the TiO$_2$—SiO$_2$ soot as compared to the SiO$_2$ soot indicates that the TiO$_2$—SiO$_2$ soot has a higher OH content than the SiO$_2$ soot.

Figure 14C:
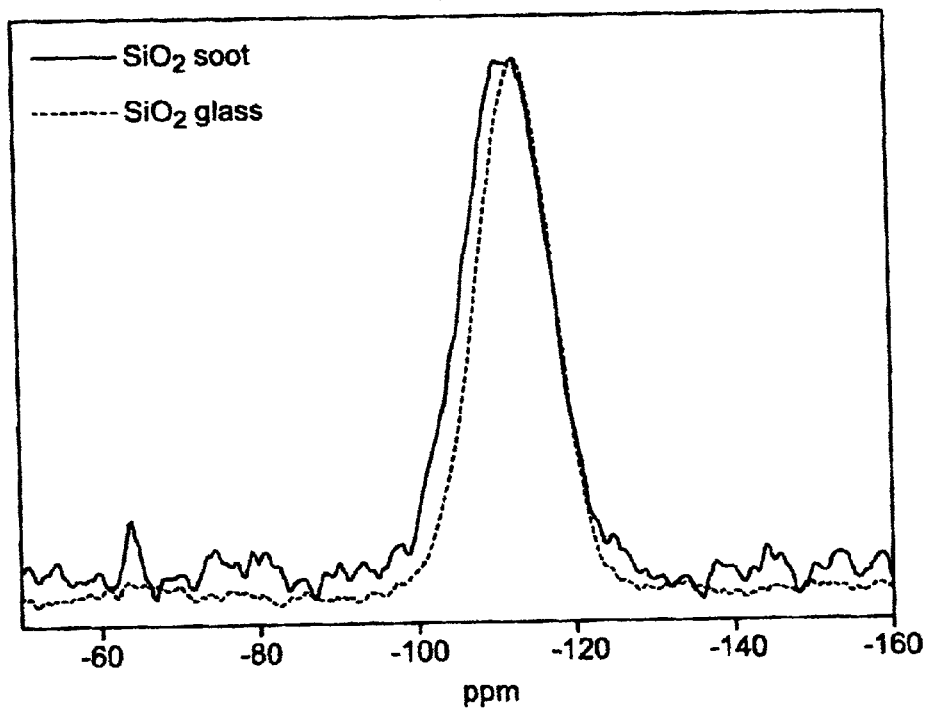
Figure 14D:
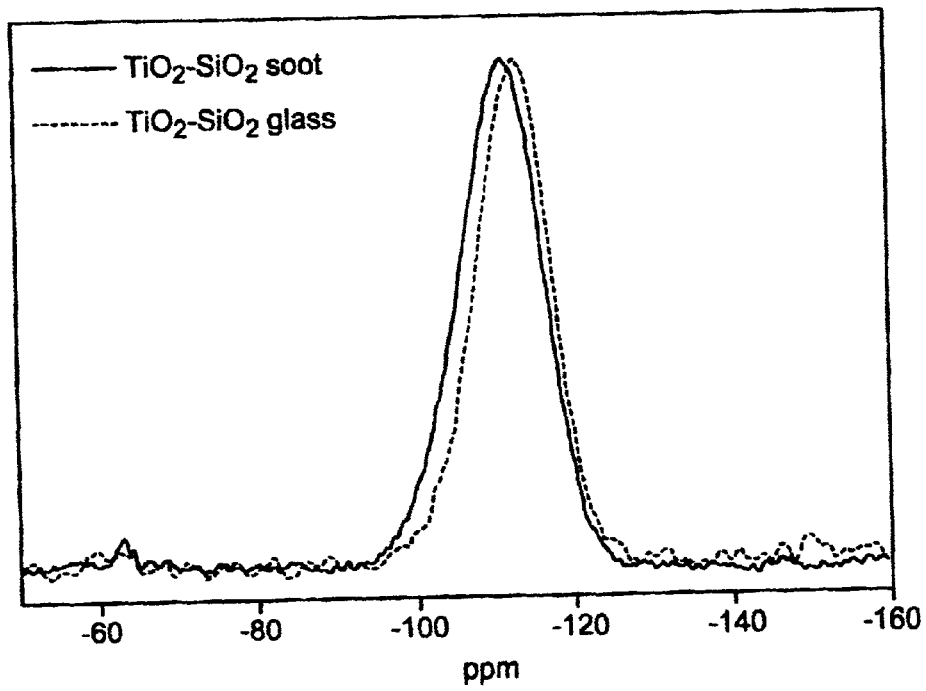

In order to determine potential variations in structure between the soot particles and glasses obtained by consolidation of the soot, $^{29}$Si MAS-NMR spectra were also obtained for each direct deposition glass (see FIGS. 14(c) and (d)). Both glasses have identical spectra (i.e., $TiO_2$ influence on $^{29}$Si shift could not be resolved) with a $^{29}$Si $Q^4$ peak centered at −112 ppm for the $SiO_2$ glass and at −113 ppm for the $TiO_2$—$SiO_2$ glass. The $^{29}$Si peaks for each glass are also shifted by 2 ppm upfield relative to each soot. This upfield shift could be caused by lower OH content and/or higher degree of condensation of silica in the glasses as compared to the corresponding soot particles. Since each soot was formed in a high temperature flame, each is expected to be highly condensed. However, surface area for each soot is much higher than that of each direct deposition glass, and each soot may react with atmospheric moisture to form silanol groups which shift peak positions upfield.

Surface charge properties determined for the fused $SiO_2$ and $TiO_2$—$SiO_2$ soot materials shows that the addition of $TiO_2$ into the $SiO_2$ structure increased surface acidity and surfaces charge, while lowering the $pH_{PZC}$. A comparison of results determined in this report for the fused $SiO_2$ soot to results previously reported for a $SiO_2$ gel (P. Schindler, H. R. Kamber, Helvetica Chim Acta 51 (1968) 1781) showed equivalent values for both materials (intrinsic $pK_{a2}$ values of 7.0±0.1 and 6.8±0.2 respectively). Although no structural analysis was performed in the referenced research on the $SiO_2$ gel, analysis of the soot materials showed that the fused $SiO_2$ soot has less OH than $TiO_2$—$SiO_2$ soot. This is potentially the reason that surface charge of the $TiO_2$—$SiO_2$ soot was higher than that of $SiO_2$ soot.

The fact that $TiO_2$—$SiO_2$ soot has more acidic surface ($pK_{a2}$=5.0, Table II) than the $SiO_2$ soot ($pK_{a2}$=7.0, Table II) is rather unexpected. Values for $pK_{a2}$ of pure colloidal crystalline $TiO_2$ (rutile or anatase) range from 7.4 to 9.1, which is significantly higher than $pK_{a2}$ value of 6.8 reported for fumed silica (P. Schindler, H. R. Kamber, Helvetica Chim Acta 51 (1968) 1781). Because surface Ti—OH is less acidic than Si—OH, and Ti is less electronegative than Si, it would also be expected that the $pK_{a2}$ of $TiO_2$—$SiO_2$ soot should be higher than the $pK_{a2}$ of $SiO_2$ soot. Furthermore, given that the $pH_{PZC}$ of crystalline $TiO_2$ is about 2.5 pH units higher than $pH_{PZC}$ of silica, it would be expected that the addition of $TiO_2$ to $SiO_2$ should increase the isoelectric point. However, the referenced surface chemistry data are only available for 6-fold coordinated $TiO_2$ (i.e., rutile and anatase). The XRD analysis of the $TiO_2$—$SiO_2$ soot used in this study indicates that the $TiO_2$—$SiO_2$ soot is a glass (i.e., there are no crystalline $TiO_2$ phases present). It has been shown that Ti4+ is in a tetrahedral coordination in a glass with ~7 wt. % $TiO_2$ in $SiO_2$ made by flame hydrolysis. The lower coordination state of tetrahedral Ti would increase the polarity of Ti—O bond compared to 6-coordinate Ti. However, it is unlikely that 4-fold Ti would exist on the soot surface in the aqueous system studied here because water would immediately fill the two empty coordination sites. The as-formed Ti—OH on the surface of $TiO_2$—$SiO_2$ soot would be expected to have the properties similar to Ti—OH on rutile or anatase surface, which is contrary to what is discovered here. Therefore, the orthotitanate [$TiO_4$]4-groups must be within the soot. To account for the increase in surface acidity (i.e., less electron density on the surface silanol group) of $TiO_2$—$SiO_2$ compared to $SiO_2$ soot, the orthotitanate groups must be strongly electron withdrawing. Thus it is proposed that the increased surface acidity and lower $pH_{PZC}$ of the $TiO_2$—$SiO_2$ soot compared to the pure $SiO_2$ soot is due to the tetrahedral coordination of Ti in the soot.

A potential difference in solubility behavior between the soot particles and the parent glasses exists due to the difference in thermal history. With recovery of the fused $SiO_2$ and $TiO_2$—$SiO_2$ soot particles 32 as a byproduct from the manufacturing process and exhausted from the furnace, the annealing cycle that the glass body boule undergoes in the furnace is not applied to the soot. Research has shown that the annealing process for E-glass lowers the rate of acid corrosion, indicating that glass surfaces become less hydroxylated during annealing. FIGS. 14(c) and (d) demonstrate very similar degree of condensation of soot and glass, the major difference being higher $Q^3$ component in the $^{29}$Si signal of each soot most likely due to higher OH content caused by much higher surface area of soot 32 compared to glass. The annealing process may also have decreased the OH content of each glass, resulting in a higher surface charge per unit area expected for each soot as compared to the glass surfaces. Thus, the glass surface might show higher corrosion resistance than the soot particles. However, there is no reason to suspect that structural relaxation during annealing affects surface charge results. Thus, the dissociation constants of the $SiO_2$ soot and $TiO_2$—$SiO_2$ soot materials are believed to be the same for the parent glasses, with the difference in structural relaxation and condensation affecting only the number of surface OH groups which in turn affects the surface reactivity in processes such as corrosion.

The differences between $SiO_2$ soot 32 and $TiO_2$—$SiO_2$ soot 32 in values of $pK_{a2}$ and point of zero charge ($pH_{PZC}$) indicate substantially different surface properties and reactivity of the two corresponding glasses. The greater surface acidity of the $TiO_2$—$SiO_2$ glass compared to fused $SiO_2$ glass may result in different behavior in terms of adhesion, particulate interactions during polishing, dissolution/corrosion of the glass surface and the removal of particles from surfaces during cleaning.

Titration experiments in aqueous solutions designed to measure the surface charge, acidity, and point of zero charge of $SiO_2$ and $TiO_2$—$SiO_2$ (~7 weight % $TiO_2$) soot 32 (colloidal glass made by flame hydrolysis) indicate that the two soots have different surface properties. Fused $SiO_2$ and $TiO_2$—$SiO_2$ soot particles in dilute aqueous suspension with NaCl as a background electrolyte have $pH_{PZC}$ of 3.5±0.1 and 2.5±0.1 respectively, intrinsic $pK_{a1}$ values of 0.0±0.1 and 0.0±0.2 respectively, and intrinsic $pK_{a2}$ values of 7.0±0.1 and 5.0±0.2 respectively. The difference in point of zero charge and intrinsic pKa values shows that the addition of $TiO_2$ influences the surface charge behavior of $SiO_2$, an effect which is believed to be due to 4-fold coordination of the $TiO_2$ in the $TiO_2$—$SiO_2$ structure. A 2 ppm downfield shift of the $Q^4$ silicon in the $^{29}$Si MAS NMR spectra for each of the soot particles was found relative to the corresponding glasses. Because the surface area of soot is much greater than that of glass, a slightly higher $Q^3$ component in the soot relative to glass is most likely due to greater proportion of surface silanol groups. Since the degree of condensation in each soot and glass is similar, the data obtained on soot surfaces is believed to be useful in understanding the surface properties of each glass in aqueous systems.

Synthesis of $SiO_2$ abrasive particles has typically been achieved through either sol-gel processing or flame hydrolysis to form fumed silica. Fumed silica abrasive particles which are formed by flame hydrolysis have high surface areas (>100 m$^2$/gram). With flame hydrolysis of fumed silica particles amorphous silicon dioxide is produced by introducing volatile trichlorosilane into a hydrogen/oxygen flame. Hydrolysis at about 1200° C. produces fumed silica and hydrogen chloride. Under the reaction conditions in the flame, high viscosity $SiO_2$ primary particles of the order of about 10 nanometers (10–9 m) are first produced. The $SiO_2$ surface of these particles is smooth and not microporous. In the flame these primary particles fuse into larger units, known as aggregates, of the order of 100 to 500 nanometers. On cooling these aggregates flocculate to form agglomerates, also called tertiary structures. Such agglomerates as WACKER HDK® fumed silica agglomerates measure between 10–50 micrometers. Fumed silica such as WACKER HDK® aggregates are open structured and therefore macroporous. The large available surface area of the fumed silica aggregates and agglomerates is responsible for fumed silica's high specific surface area (BET). (See WACKER HDK® Fumed Silica—The Product, www.wacker.del english/hdk/product_e.htm, Oct. 5, 1999). Soot 32 of the invention are produced by flame hydrolysis at high temperatures greater than 1300° C., preferably >1400° C., more preferably >1500° C. such as 1600° C., and have relatively low surface areas less than 100 $m^2$/gram. Soot 32 particles spend extended times at the high temperatures to result in solid spherical soot particles with the low surface areas.

Rheological experiments were performed for 3 and 6 weight percent $SiO_2$ slurries prepared in $10^{-3}$ M NaCl and adjusted to pH 2, 4, and 6 using dilute HCl and NaOH, using a variable speed viscometer with an ultra-low concentric cylinder adapter at 20.0±0.1° C. Shear stress and viscosity measurements were made at shear rates starting at 0.5 and increasing to 100 $s^{-1}$, followed by a hold at 100 $s^{-1}$ before decreasing down to 0.5 $s^{-1}$. In this manner, each slurry was characterized for agglomeration and gellation effects observed from the hysteresis using curve fitting software and by calculating the difference between areas under the shear stress curves for increasing and decreasing shear rates.

Results show that the inventive fused silica soot particles 32 exhibit greater slurry stability in terms of less agglomeration and/or gellation effects when mixed into a slurry 30. Soot 32 has beneficial lower surface areas, thus promoting lower concentrations of surface charges in solution where particles are mixed to identical weight percents in comparison to fumed silica particles. As a result, the soot 32 can me mixed to greater solids loading (e.g., >10 weight percent) while maintaining lower viscosity values and reflecting Newtonian behavior.

The acidic dispersion behavior of soot particles 32 is compared herein to two fumed $SiO_2$ abrasive particle brands (Degussa and Cabot). The fused $SiO_2$ Soot particles 32 have a larger particle size, broader size distribution, and lower surface area. Fluoride adsorption was used to study surface activity, and acid-base titration was used to study surface charge in $10^{-1}$ to $10^{-3}$ M NaCl solutions over the pH range of 2–7.5. Each of the three $SiO_2$ particles exhibited similar titration behavior, with the fused $SiO_2$ soot particles 32 displaying a higher intrinsic $pK_{a2}$ value of 7.0 as compared to 6.8 and 6.1 for the two fumed $SiO_2$ particles. Rheological experiments designed to test for dispersion and agglomeration/gellation at 3 and 6 weight percent solids loading in $10^{-3}$ M NaCl solutions adjusted to pH 2, 4, and 6 showed the fused $SiO_2$ soot particles 32 to be more stable in suspension, exhibiting lower viscosity results for all test conditions. Results show that the fused $SiO_2$ soot particles 32 display superior dispersion properties as compared to conventional fumed $SiO_2$ particles slurry applications under acidic conditions.

TABLE III

Surface properties determined by fluoride adsorption and acid-base titration of colloidal $SiO_2$ particles. Dissociation constants determined by acid-base titration of particles mixed to 150 $m^2$/100 ml in $10^{-1}$, 10-2, and 10-3M NaCl.

| Property | HPFS ® | Degussa OX50 | Cabot 10M |
|---|---|---|---|
| Composition | 100% $SiO_2$ | 100% $SiO_2$ | 100% $SiO_2$ |
| Particle type | Fused Soot | Fumed | Fumed |
| Surface Area ($m^2$/g) | 14.79 | 53.30 | 199.67 |
| Surface Activity (×10−6 moles/$m^2$) | 17.9 ± 1.0 | 8.7 ± 1.0 | 4.3 ± 1.0 |
| Intrinsic pKa1 | −0.4 ± 0.2 | −0.5 ± 0.5 | −0.4 ± 0.1 |
| Intrinsic $pK_{a2}$ | 7.0 ± 0.1 | 6.8 ± 0.1 | 6.1 ± 0.1 |
| Isoelectric Point ($pH_{IEP}$) | 3.3 ± 0.2 | 3.1 ± 0.3 | 2.8 ± 0.1 |

TABLE IV

Rheological behavior of $SiO_2$ particles at 20.0 ± 0.1° C. dispersed to 3 and 6 weight percent in 0.001M NaCl at pH 2, 4, and 6.

| Slurry Mix | $SiO_2$ Particles | Rheological Behavior | Shear Stress (D/$cm^2$) | Viscosity (cP) | Power Law Index | Agglomeration (+) or Gellation (−) |
|---|---|---|---|---|---|---|
| 3 wt % pH 2 | A | Newtonian | 1.50 | 1.83 | — | −2.8 |
|  | B | Shear Thinning | 3.29 | 4.03 | −0.51 | +0.4 |
|  | C | Shear Thinning | 2.17 | 2.66 | −0.09 | −4.1 |
| 3 wt % pH 4 | A | Newtonian | 1.35 | 1.65 | — | −2.4 |
|  | B | Shear Thinning | 2.75 | 3.37 | −0.41 | +6.1 |
|  | C | Shear Thinning | 4.03 | 4.92 | −0.54 | +33.3 |
| 3 wt % pH 6 | A | Newtonian | 1.31 | 1.61 | — | −3.1 |
|  | B | Newtonian | 1.56 | 1.91 | — | −7.4 |
|  | C | Shear Thinning | 4.43 | 5.42 | −0.49 | +55.7 |
| 6 wt % pH 2 | A | Newtonian | 2.78 | 2.27 | — | −2.8 |
|  | B | Shear Thinning | 5.24 | 6.41 | −0.73 | +1.7 |
|  | C | Shear Thinning | 4.54 | 5.55 | −0.20 | −5.7 |
| 6 wt % pH 4 | A | Newtonian | 1.31 | 1.61 | — | −0.3 |
|  | B | Shear Thinning | 3.84 | 4.70 | −0.61 | +8.6 |
|  | C | Shear Thinning | 7.13 | 8.72 | −0.58 | +41.4 |
| 6 wt % | A | Newtonian | 1.31 | 1.61 | — | −3.1 |

TABLE IV-continued

Rheological behavior of SiO$_2$ particles at 20.0 ± 0.1° C.
dispersed to 3 and 6 weight percent in 0.001M NaCl at pH 2, 4, and 6.

| Slurry Mix | SiO$_2$ Particles | Rheological Behavior | Shear Stress (D/cm$^2$) | Viscosity (cP) | Power Law Index | Agglomeration (+) or Gellation (−) |
|---|---|---|---|---|---|---|
| pH 6 | B | Shear Thinning | 1.91 | 2.33 | −0.17 | −11.0 |
|  | C | Shear Thinning | 8.06 | 9.86 | −0.53 | +194.6 |

Particle codes are
(A) HPFS ® fused soot SiO$_2$,
(B) Degussa 0 X 50 fumed SiO$_2$, and
(C) Cabot 10M fumed SiO$_2$.
Shear stress and viscosity values given are for a shear rate of 122.3 l/sec.
Agglomeration (positive values) and gellation (negative values) are quantified in terms of the difference in integration values from curves fitted to shear stress data for increasing and decreasing shear rate schedules (i.e., differences in area under each curve).

FIG. 15 is a transmission electron micrograph of soot 32 of the invention. FIG. 16 is a transmission electron micrograph of fumed silica Degussa® 0×50 brand fumed SiO2. FIG. 17 is a transmission electron micrograph of fumed silica Cabot® 10M brand fumed SiO$_2$. A comparison of FIG. 15 with FIGS. 16–17 clearly shows the distinctions between the soot 32 of the invention and fumed silica particles.

FIGS. 18(a–f) are plots of shear rate (1/sec) vs. shear stress (D/cm$^2$) of the compared silica particles in slurry. The open circle shows high purity fused silica soot in accordance with the invention. The open square designates the Degussa fumed silica. The open triangle designates the Cabot fumed silica. FIG. 18(a) are 10$^{-3}$ M NaCl 3 weight percent solids loading slurry adjusted to pH 2. FIG. 18(b) are 10$^{-3}$ M NaCl 3 weight percent solids loading slurry adjusted to pH 4. FIG. 18(c) are 10$^{-3}$ M NaCl 3 weight percent solids loading slurry adjusted to pH 6. FIG. 18(d) are 10$^{-3}$ NaCl 6 weight percent solids loading slurry adjusted to pH 2. FIG. 18(e) are 10$^{-3}$ NaCl 6 weight percent solids loading slurry adjusted pH 4. FIG. 18(f) are 10$^{-3}$ NaCl 6 weight percent solids loading slurry adjusted pH 6.

Such comparison shows that the inventive colloidal fused silica soot 32 is resistant to catastrophic viscosity changes for slurries mixed to varying degrees of solids loading. For example, at 3 weight percent solids loading both soot 32 and the commercially available fumed SiO$_2$ have similar viscosity behavior across the pH regime (pH 2–12). However and specifically at low pH values (less than 7), an increase in solids loading (e.g., from 3–6 weight percent) results in a significant increase in viscosity and agglomeration/gellation behavior for the commercially available fumed silica competition. Soot 32 reflects relatively no change under the same conditions.

The invention includes a method of making an optical fluoride crystal polishing slurry. As shown in FIGS. 19–21 optical fluoride crystal polishing slurry 30 is comprised of soot 32. The method includes providing a pre-slurry solvent 61 and dispersing soot particles 32 in solvent 61 to form optical fluoride crystal polishing slurry 30. Pre-slurry solvent 61 is preferably a water based slurry solvent. Solvent 61 of slurry 30 is preferably a purified distilled deionized H$_2$O liquid. Dispersing of soot 32 in solvent 61 is provided by shear mixing.

The method of making slurry 30 includes loading at least 1 wt. % of the soot, and more preferably greater than 3 wt. % of the soot in the slurry. Loading at least 1 wt. % preferably includes loading up to 15 wt. % soot into the slurry. With a slurry pH in the range of 1 to 12, more preferably a pH≦7, the slurry has stability with loadings in the 3 to 10 wt. % range. The soot slurry 30 has beneficial stability at loadings greater than 3 wt. % as compared to fumed silica slurries, and particularly beneficial 3 and 6 wt. % loadings with low pH's<7. The method includes dispersing a greater than 3 wt. %, preferably 6 wt. %, more preferably 10 wt. % loading of soot wherein the slurry is agglomeration inhibited, gellation inhibited, and has a stabilized viscosity.

Particulate abrasive agent silica soot 32 preferably are non-agglomerated solid sphere fused silica soot particles with a particle size distribution between 30 nm and 300 nm. Preferably soot 32 is a high purity fused silica soot. In a preferred embodiment soot 32 is a doped fused silica glass soot. In an embodiment the doped fused silica glass soot 32 is a Ti doped fused silica glass soot. In an embodiment the doped fused silica glass soot 32 is a Ge doped fused silica glass soot. In an embodiment the doped fused silica glass soot 32 is an Al doped fused silica glass soot. In an embodiment the doped fused silica glass soot 32 is a B doped fused silica glass soot. In an embodiment the doped fused silica glass soot 32 is a P doped fused silica glass soot. In an embodiment the doped fused silica glass soot 32 is a Zr doped fused silica glass soot. In an embodiment the doped fused silica glass soot 32 is a Er doped fused silica glass soot. In an embodiment the doped fused silica glass soot 32 is a Ce doped fused silica glass soot. In an embodiment the doped fused silica glass soot 32 is a lanthanide metal doped fused silica glass soot.

Particulate abrasive agent silica soot 32 are preferably soot particles having a mean particle size in the range of 0.3 to 0.5 μm. Preferably soot 32 have a particle surface area less than 100 m$^2$/gram, more preferably no greater than 50 m$^2$/gram, and more preferred no greater than 20 m$^2$/gram. In a preferred embodiment soot 32 has a particle surface area in the range of about 10 to 20 m$^2$/gram.

Soot particles 32 preferably have a surface activity ≧1.5× 10−5 moles/meter. Preferably soot 32 has an intrinsic pK$_{a1}$ of 0.0±0.2 and an intrinsic pK$_{a2}$ of 7.0±0.1, preferably with an isoelectric point of 3.5±0.1. In a further embodiment soot 32 has an intrinsic pK$_{a1}$ of 0.0±0.1 and a n intrinsic pK$_{a2}$ of 5.0±0.2, preferably with an isoelectric point of 2.5±0.1. In the preferred Ti doped soot 32, the soot have an increased insolution surface charge over that of pure SiO$_2$. The Ti doped soot have an increased low pH stability insolation at pH values <5.0, which is improved stability over pure undoped high purity SiO$_2$.

Providing soot particles 32 preferably includes collecting fused silica soot particles as a byproduct from a chemical vapor deposition glass making process. In a preferred embodiment collecting includes collecting high purity fused silica soot particles as an exhausted byproduct form a direct deposition high purity fused silica glass making process where the soot has evaded being deposited in the glass making process as intended and been exhausted as a particulate emission. In an alternative embodiment collecting includes collecting Ti doped fused silica glass soot particles as a byproduct from an ultra low expansion glass making process. In a further embodiment collecting soot 32 includes collecting the soot as a byproduct from an optical waveguide glass making process, preferably as a doped silica glass soot or as an undoped fused silica soot. Collecting soot 32 as a byproduct from a chemical vapor deposition glass making process preferably includes sedimentation/floatation separating the byproduct soot particles 32 from a glass making process contaminant. Such a slurry making process is shown in FIGS. 19–21. As shown in FIG. 19, chemical vapor deposition glass making process byproduct soot particles 32 are dispersed into a purified water pre-slurry solvent 61 contained in a sedimentation/floatation separation vessel to form a slurry 30. The dispersed slurry mixture is allowed to settle rest such that floating contaminants 80 collect near the top and sedimentary contaminants 80 collect near the bottom with the slurry of soot byproduct soot 32 in between as shown in FIG. 20. Slurry 30 of soot 32 is selectively removed and separated from the above and below glass making process contaminants.

Providing soot particles 32 includes providing a conversion site, maintaining the conversion site at a temperature above 1300° C., producing a conversion site flame, introducing a silicon feedstock compound into the conversion site flame, generating a plurality of high purity silica pre-soot intermediates, keeping the pre-soot silica intermediates under prolonged residence times at the temperature above 1300° C., and growing and sintering the pre-soot silica intermediates simultaneously into fused silica soot spheres before collecting the soot particles.

The invention includes a method of polishing an optical fluoride single crystal. In a preferred embodiment the method includes a method of polishing an optical calcium fluoride single crystal. As shown in FIGS. 1–2, the method includes providing an optical fluoride crystal 44 having an initial finished optical transmission surface 29. The method includes providing a final polishing fused silica soot solution 30, said final polishing solution comprised of a plurality of particulate abrasive agent colloidal solid sphere fused silica soot particles 32 and polishing the optical fluoride crystal optical transmission surface with said final polishing colloidal solid sphere fused silica soot solution to provide a final polished optical fluoride crystal optical transmission surface 36. Preferably polishing includes polishing to a final polished surface roughness less than 1 nm RMS, and more preferably to a final polished surface roughness less than 0.75 nm RMS.

The present invention provides for the application of colloidal silica produced as a byproduct of chemical vapor deposition processing of fused silica or ultra low expansion glasses (colloidal silica byproduct soot) in the optical fluoride crystal finishing industry. Retaining the same physical properties as the parent glass and having a spherical morphology, the colloidal silica soot is an ideal candidate for final polishing applications of fluoride optical crystals, and preferably for single optical calcium fluoride crystals. The soot has a large particle size when compared to conventional colloidal or fumed silica.

Conventional colloidal silica typically has an average particle size of 50 nanometers (nm) or less. Broadly, the colloidal silica soot particulate polishing agent of this invention has an average particle size ranging from above 50 nm to 500 nm. More specifically, the colloidal silica soot has an average particle size ranging from 100 nm to 400 nm.

Preferably, the colloidal silica soot has an average particle size ranging from 250 nm to 350 nm. More preferably, the colloidal silica soot has an average particle size of about 300 nm.

Generally, the soot has a specific surface area of 20 $m^2/g$ or less. Preferably, the specific surface area is 10 to 20 $m^2/g$ and more preferably the surface area is 15 to 20 $m^2/g$.

The inventive solution is preferably adjusted to a pH that will allow for attainment of the best surface finish, form and figure, and the solution is stabilized from agglomeration and pH shifts during storage.

Physical properties for the fused silica (FS) and ultra low expansion (ULE) soot materials are identical to those for the parent glasses from whose manufacturing process the soot is a byproduct. Exemplary properties are shown in Table A below.

TABLE A

| Property | FS | ULE |
| --- | --- | --- |
| Density (g/cc) | 2.20 | 2.20 |
| Knoop Hardness (HK100) | 489 | 430 |
| Elastic Modulus (GPa) | 73 | 67 |
| Mean Particle Size (m) | 0.3 | 0.3 |
| Surface Area ($m^2/g$) | 15.7 | 17.7 |

Generally, the aqueous solution of colloidal silica soot is buffered to a pH ranging from 2 to 12, and preferably from 5 to 12. Preferably, the aqueous solution of colloidal silica soot is buffered to a pH ranging from 9 to 12 and more preferably the aqueous solution of colloidal silica soot is buffered to a pH ranging from 10 to 11.

EXAMPLE

Polishing experiments were as follows. Samples of calcium fluoride crystals were machined via grinding and lapping processes to form a flat surface with minimal subsurface damage with an initially polished surface having a surface finish of about 2.0 nm RMS. Final polishing of the calcium fluoride crystal samples to a 0.5 nm RMS final polished surface with conventional colloidal fumed silica resulted in a 80% reduction in flatness of the samples flat surface. Final polishing of the calcium fluoride crystal samples to a 0.5 nm RMS final polished surface with the inventive colloidal fused silica solid spherical soot resulted in only a 20% reduction in flatness of the samples flat surface.

Solutions preferably prepared from the soot are buffered using a potassium-based solution between pH 10–11. The colloidal silica soot buffered solution can be used in combination with a synthetic soft polishing pad such as Rodel Incorporated's Product Code 204 or Rodel Incorporated's Politex brand pad.

The invention includes a calcium fluoride optical crystal final polishing agent of colloidal silica soot, preferably with the final polishing agent colloidal silica soot having an average particle size ranging from above 50 nm to 500 nm. In preferred embodiments the optical fluoride crystal final polishing agent colloidal silica soot has an average particle size ranging from 100 nm to 400 nm, more preferably from 250 nm to 350 nm, and most preferably an average particle size of about 300 nm. In preferred embodiments the optical fluoride crystal final polishing agent colloidal silica soot has a spherical morphology. In preferred embodiments the optical fluoride crystal final polishing agent colloidal silica soot has a specific surface area of 20 m²/g or less. Preferably the optical fluoride crystal final polishing agent colloidal silica soot has a specific surface area of 10 to 20 m²/g, and more preferably a specific surface area of 15 to 20 m²/g. In preferred embodiments the optical fluoride crystal final polishing agent colloidal silica soot is a byproduct of chemical vapor deposition processing of fused silica or ultra low expansion glasses. In a preferred embodiment the optical fluoride crystal final polishing agent colloidal silica soot is an aqueous solution of colloidal silica soot that is buffered to a pH ranging from 5 to 12, preferably a pH ranging from 9 to 12, and more preferably a pH ranging from 10 to 11.

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

What is claimed:

1. A method of making optical fluoride crystal components, said method comprising:
   providing an optical fluoride crystal having an initial polish finished surface with an initial finish surface roughness greater than 1 nm RMS and an initial finish flatness;
   providing an optical fluoride crystal final polishing solution, said final polishing solution comprised of a plurality of particulate abrasive agent colloidal silica soot, polishing with said provided optical fluoride crystal final polishing solution said provided optical fluoride crystal initial polish finished surface to a final polished surface having a reduction in flatness no greater than 50% of said initial finish flatness, and said final polished surface having a final polished surface roughness less than 1 nm RMS.

2. A method as claimed in claim 1 wherein providing an optical fluoride crystal having an initial polish finished surface with an initial finish surface roughness greater than 1 nm RMS includes providing an optical fluoride crystal having an initial polish finished surface with an initial finish surface roughness no greater than 5 nm RMS.

3. A method as claimed in claim 1 wherein polishing includes polishing to a final polished surface having a final polished surface roughness less than 0.75 nm RMS.

4. A method as claimed in claim 1 wherein polishing includes polishing to a final polished surface having a final polished surface roughness no greater than 0.5 nm RMS.

5. A method as claimed in claim 1 wherein polishing includes polishing to a final polished surface having a reduction in flatness no greater than 30% of said initial finish flatness.

6. A method as claimed in claim 1 wherein polishing includes polishing to a final polished surface having a reduction in flatness no greater than 25% of said initial finish flatness.

7. A method as claimed in claim 1 wherein providing an optical fluoride crystal final polishing solution comprised of a plurality of particulate abrasive agent colloidal silica soot includes providing an optical fluoride crystal final polishing solution comprised of a plurality of particulate abrasive agent colloidal solid sphere fused silica soot particles.

8. A method as claimed in claim 1 wherein providing an optical fluoride crystal final polishing solution comprised of a plurality of particulate abrasive agent colloidal silica soot includes providing an optical fluoride crystal final polishing solution comprised of a plurality of particulate abrasive agent colloidal solid sphere fused silica soot particles having an average particle size ranging from above 50 nm to 500 nm.

9. A method as claimed in claim 1 wherein said soot has a specific surface area of 20 m²/g or less.

10. A method as claimed in claim 1 wherein providing an optical fluoride crystal comprises providing a calcium fluoride crystal.

11. A method as claimed in claim 1 wherein providing an optical fluoride crystal comprises providing a barium fluoride crystal.

12. A method as claimed in claim 1 wherein providing an optical fluoride crystal comprises providing a magnesium fluoride crystal.

13. A method as claimed in claim 1 wherein providing an optical fluoride crystal comprises providing a lithium fluoride crystal.

14. A method as claimed in claim 1 wherein providing an optical fluoride crystal final polishing solution includes providing a slurry having a plurality of non-agglomerated solid sphere fused silica soot particles with a particle size distribution between 30 nm and 300 nm.

15. A method as claimed in claim 1 wherein providing an optical fluoride crystal final polishing solution includes providing high purity fused silica soot particles.

16. A method as claimed in claim 1 wherein providing an optical fluoride crystal final polishing solution includes providing doped fused silica glass soot particles.

17. A method as claimed in claim 1 wherein providing an optical fluoride crystal final polishing solution includes providing Ti doped fused silica glass soot particles.

18. A method as claimed in claim 1 wherein providing an optical fluoride crystal final polishing solution includes providing Ge doped fused silica glass soot particles.

19. A method as claimed in claim 1 wherein providing an optical fluoride crystal final polishing solution includes providing Al doped fused silica glass soot particles.

20. A method as claimed in claim 1 wherein providing an optical fluoride crystal final polishing solution includes providing B doped fused silica glass soot particles.

21. A method as claimed in claim 1 wherein providing an optical fluoride crystal final polishing solution includes providing P doped fused silica glass soot particles.

22. A method as claimed in claim 1 wherein providing an optical fluoride crystal final polishing solution includes providing Zr doped fused silica glass soot particles.

23. A method as claimed in claim 1 wherein providing an optical fluoride crystal final polishing solution includes providing Er doped fused silica glass soot particles.

24. A method as claimed in claim 1 wherein providing an optical fluoride crystal final polishing solution includes providing Ce doped fused silica glass soot particles.

25. A method as claimed in claim 1 wherein providing an optical fluoride crystal final polishing solution includes providing periodic table of elements lanthanide series metal doped fused silica glass soot particles.

26. A method as claimed in claim 1 wherein providing an optical fluoride crystal final polishing solution includes providing soot particles having a mean particle size in the range of 0.3 to 0.5 μm.

27. A method as claimed in claim 1 wherein providing an optical fluoride crystal final polishing solution includes providing soot particles having a particle surface area less than 100 m²/gram.

28. A method as claimed in claim 1 wherein providing an optical fluoride crystal final polishing solution includes providing soot particles having a particle surface area no greater than 50 m²/gram.

29. A method as claimed in claim 1 wherein providing an optical fluoride crystal final polishing solution includes providing soot particles having a particle surface area no greater than 20 m²/gram.

30. A method as claimed in claim 1 wherein providing an optical fluoride crystal final polishing solution includes providing soot particles having a particle surface area in the range of about 10 to 20 m²/gram.

31. A method as claimed in claim 14 wherein providing an optical fluoride crystal final polishing solution wherein said slurry has a stabilized dispersion viscosity.

32. A method as claimed in claim 1 wherein providing an optical fluoride crystal final polishing solution includes providing soot particles wherein said soot have a surface activity $\geq 1.5 \times 10^{-5}$ moles/meter.

33. A method as claimed in claim 1 wherein providing an optical fluoride crystal final polishing solution includes providing soot particles, wherein said soot have an intrinsic $pK_{a1}$ of 0.0±0.2 and an intrinsic $pK_{a2}$ of 7.0±0.1.

34. A method as claimed in claim 1 wherein providing an optical fluoride crystal final polishing solution includes providing soot particles, wherein said soot particles have an isoelectric point ($pH_{IEP}$) of 3.5±0.1.

35. A method as claimed in claim 1 wherein providing an optical fluoride crystal final polishing solution includes providing soot particles, wherein said soot have an intrinsic $pK_{a1}$ of 0.0±0.1 and an intrinsic $pK_{a2}$ of 5.0±0.2.

36. A method as claimed in claim 1 wherein providing an optical fluoride crystal final polishing solution includes providing soot particles, wherein said soot have an isoelectric point ($pH_{IEP}$) of 2.5±0.1.

37. A method as claimed in claim 1 wherein providing an optical fluoride crystal final polishing solution includes providing soot particles, wherein said colloidal silica soot has an insolution stability with said particles agglomeration resistant.

38. A method as claimed in claim 1 wherein providing an optical fluoride crystal final polishing solution includes providing soot particles, wherein said colloidal silica soot has an insolution stability with said particles gellation resistant.

39. A method as claimed in claim 1 wherein providing an optical fluoride crystal final polishing solution includes providing soot particles, wherein said colloidal silica soot has an insolution stability with said particles in said slurry having a stabilized viscosity.

40. A method as claimed in claim 1 wherein providing an optical fluoride crystal final polishing solution includes providing an aqueous slurry with a pH in the range of 2–12.

41. A method as claimed in claim 1 wherein providing an optical fluoride crystal final polishing solution includes providing an aqueous slurry with a pH in the range of 9–12.

42. A method as claimed in claim 1 wherein providing an optical fluoride crystal final polishing solution includes providing a non-aqueous solvent.

43. A method as claimed in claim 42 wherein said non-aqueous solvent is comprised of ethylene glycol.

44. A method as claimed in claim 42 wherein said non-aqueous solvent is comprised of kerosene.

45. A method of polishing an optical fluoride crystal, said method comprising:
providing an optical fluoride crystal having an optical transmission surface,
providing a final polishing fused silica soot solution, said final polishing solution comprised of a slurry having a plurality of non-agglomerated solid sphere fused silica soot particles with a particle size distribution between 30 nm and 300 nm, said slurry having a stabilized dispersion viscosity,
polishing said optical fluoride crystal optical transmission surface with said final polishing colloidal solid sphere doped fused silica soot solution to provide a polished optical fluoride crystal optical transmission surface.

46. A method of polishing an optical fluoride crystal, said method comprising:
providing an optical fluoride crystal having an optical transmission surface,
providing a final polishing fused silica soot solution, said final polishing solution comprised of a plurality of particulate abrasive agent colloidal solid sphere doped fused silica glass soot particles, having a surface activity $\geq 1.5 \times 10^{-5}$ moles/meter,
polishing said optical fluoride crystal optical transmission surface with said final polishing colloidal solid sphere doped fused silica soot solution to provide a polished optical fluoride crystal optical transmission surface.

47. A method of polishing an optical fluoride crystal, said method comprising:
providing an optical fluoride crystal having an optical transmission surface,
providing a final polishing fused silica soot solution, said final polishing solution comprised of a plurality of particulate abrasive agent colloidal solid sphere doped fused silica glass soot particles, having an intrinsic $pK_{a1}$ of 0.0±0.2 and an intrinsic $pK_{a2}$ of 7.0±0.1,
polishing said optical fluoride crystal optical transmission surface with said final polishing colloidal solid sphere doped fused silica soot solution to provide a polished optical fluoride crystal optical transmission surface.

48. A method of polishing an optical fluoride crystal, said method comprising:
providing an optical fluoride crystal having an optical transmission surface,
providing a final polishing fused silica soot solution, said final polishing solution comprised of a plurality of particulate abrasive agent colloidal solid sphere doped fused silica glass soot particles, having an isoelectric point ($pH_{IEP}$) of 3.5±0.1,
polishing said optical fluoride crystal optical transmission surface with said final polishing colloidal solid sphere doped fused silica soot solution to provide a polished optical fluoride crystal optical transmission surface.

49. A method of polishing an optical fluoride crystal, said method comprising:
providing an optical fluoride crystal having an optical transmission surface,
providing a final polishing fused silica soot solution, said final polishing solution comprised of a plurality of particulate abrasive agent colloidal solid sphere doped fused silica glass soot particles, having an intrinsic $pK_{a1}$ of 0.0±0.1 and an intrinsic $pKa_2$ of 5.0±0.2,
polishing said optical fluoride crystal optical transmission surface with said final polishing colloidal solid sphere doped fused silica soot solution to provide a polished optical fluoride crystal optical transmission surface.

50. A method of polishing an optical fluoride crystal, said method comprising:
providing an optical fluoride crystal having an optical transmission surface,
providing a final polishing fused silica soot solution, said final polishing solution comprised of a plurality of particulate abrasive agent colloidal solid sphere doped fused silica glass soot particles, having an isoelectric point ($pH_{IEP}$) of 2.5±0.1, polishing said optical fluoride crystal optical transmission surface with said final polishing colloidal solid sphere doped fused silica soot solution to provide a polished optical fluoride crystal optical transmission surface.

51. A method of polishing an optical fluoride crystal, said method comprising:

providing an optical fluoride crystal having an optical transmission surface, providing a final polishing fused silica soot solution, said final polishing solution comprised of a plurality of particulate abrasive agent colloidal solid sphere doped fused silica glass soot particles, having an insolution stability with said particles agglomeration resistant, polishing said optical fluoride crystal optical transmission surface with said final polishing colloidal solid sphere doped fused silica soot solution to provide a polished optical fluoride crystal optical transmission surface.

52. A method of polishing an optical fluoride crystal, said method comprising:

providing an optical fluoride crystal having an optical transmission surface, providing a final polishing fused silica soot solution, said final polishing solution comprised of a plurality of particulate abrasive agent colloidal solid sphere doped fused silica glass soot particles, having an insolution stability with said particles gellation resistant, polishing said optical fluoride crystal optical transmission surface with said final polishing colloidal solid sphere doped fused silica soot solution to provide a polished optical fluoride crystal optical transmission surface.

53. A method of polishing an optical fluoride crystal, said method comprising:

providing an optical fluoride crystal having an optical transmission surface, providing a final polishing fused silica soot solution, said final polishing solution comprised of a plurality of particulate abrasive agent colloidal solid sphere doped fused silica glass soot particles, having an insolution stability with said particles in said slurry having a stabilized viscosity, polishing said optical fluoride crystal optical transmission surface with said final polishing colloidal solid sphere doped fused silica soot solution to provide a polished optical fluoride crystal optical transmission surface.

54. A method of polishing an optical fluoride crystal, said method comprising:

providing an optical fluoride crystal having an optical transmission surface, providing a final polishing fused silica soot solution, said final polishing solution comprised of a plurality of particulate abrasive agent colloidal solid sphere doped fused silica glass soot particles, polishing said optical fluoride crystal optical transmission surface with said final polishing colloidal solid sphere doped fused silica soot solution to provide a polished optical fluoride crystal optical transmission surface.

55. A method as claimed in claim 54 wherein providing an optical fluoride crystal final polishing solution includes providing Ti doped fused silica glass soot particles.

56. A method as claimed in claim 54 wherein providing an optical fluoride crystal final polishing solution includes providing Ge doped fused silica glass soot particles.

57. A method as claimed in claim 54 wherein providing an optical fluoride crystal final polishing solution includes providing Al doped fused silica glass soot particles.

58. A method as claimed in claim 54 wherein providing an optical fluoride crystal final polishing solution includes providing B doped fused silica glass soot particles.

59. A method as claimed in claim 54 wherein providing an optical fluoride crystal final polishing solution includes providing P doped fused silica glass soot particles.

60. A method as claimed in claim 54 wherein providing an optical fluoride crystal final polishing solution includes providing Zr doped fused silica glass soot particles.

61. A method as claimed in claim 54 wherein providing an optical fluoride crystal final polishing solution includes providing Er doped fused silica glass soot particles.

62. A method as claimed in claim 54 wherein providing an optical fluoride crystal final polishing solution includes providing Ce doped fused silica glass soot particles.

63. A method as claimed in claim 54 wherein providing an optical fluoride crystal final polishing solution includes providing periodic table of elements lanthanide series metal doped fused silica glass soot particles.

* * * * *